United States Patent
Boyle et al.

(10) Patent No.: US 7,887,712 B2
(45) Date of Patent: Feb. 15, 2011

(54) LASER MACHINING SYSTEM AND METHOD

(75) Inventors: Adrian Boyle, Monasterevin (IE);
Oonagh Meighan, Dublin (IE); Gillian Walsh, Dublin (IE); Kia Woon Mah, Dublin (IE)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 10/102,702

(22) Filed: Mar. 22, 2002

(65) Prior Publication Data

US 2002/0170891 A1    Nov. 21, 2002

(30) Foreign Application Priority Data

Mar. 22, 2001 (EP) ................................. 01650029
Mar. 22, 2001 (IE) ................................. 2001/0298

(51) Int. Cl.
*H01L 21/302* (2006.01)
*B23K 26/00* (2006.01)

(52) U.S. Cl. ............... 216/65; 219/121.69; 219/121.71; 438/707; 438/940

(58) Field of Classification Search .................... 216/65
See application file for complete search history.

(56) References Cited

U.S. PATENT DOCUMENTS

| | | | |
|---|---|---|---|
| 3,632,398 A | | 1/1972 | Konig |
| 3,773,404 A | * | 11/1973 | Moore ........................ 359/785 |
| 4,260,649 A | * | 4/1981 | Dension et al. ............. 427/582 |
| 4,341,942 A | | 7/1982 | Chaudhari et al. .......... 219/121 |
| 4,615,756 A | * | 10/1986 | Tsujii et al. ................. 156/345 |
| 4,624,736 A | * | 11/1986 | Gee et al. ...................... 216/65 |
| 4,639,572 A | | 1/1987 | Gruzman et al. |
| 4,705,593 A | * | 11/1987 | Haigh et al. ................. 438/708 |
| 4,972,061 A | * | 11/1990 | Duley et al. ............ 219/121.66 |
| 5,055,696 A | * | 10/1991 | Haraichi et al. .......... 250/492.2 |
| 5,059,763 A | | 10/1991 | O'Brien et al. ............. 219/121 |
| 5,292,686 A | * | 3/1994 | Riley et al. ................. 437/173 |
| 5,322,988 A | * | 6/1994 | Russell et al. .......... 219/121.69 |

(Continued)

FOREIGN PATENT DOCUMENTS

DE    4309279 A1    9/1994

(Continued)

OTHER PUBLICATIONS (Webster's II New Riverside Univ. Dictionary,) 1994, p. 412.*

(Continued)

*Primary Examiner*—Anita K Alanko
(74) *Attorney, Agent, or Firm*—McDonnell Boehnen Hulbert & Berghoff LLP

(57) ABSTRACT

A substrate (16) is machined to form, for example, a via. The substrate is in a chamber (15) within which the gaseous environment is controlled. The machining laser beam (13) is delivered with control of parameters such as pulsing parameters to achieve desired effects. The gaseous environment may be controlled to control integral development of an insulating lining for a via, thereby avoiding the need for downstream etching and oxide growth steps. Also, machining may be performed in multiple passes in order to minimize thermal damage and to achieve other desired effects such as a particular via geometry.

53 Claims, 16 Drawing Sheets

U.S. PATENT DOCUMENTS

| | | | |
|---|---|---|---|
| 5,411,918 A | 5/1995 | Keible et al. | 437/209 |
| 5,431,774 A * | 7/1995 | Douglas | 216/57 |
| 5,525,190 A | 6/1996 | Wojnarowski et al. | 375/133 |
| 5,734,146 A * | 3/1998 | La Rocca | 219/121.72 |
| 5,747,769 A * | 5/1998 | Rockstroh et al. | 219/121.71 |
| 5,849,638 A * | 12/1998 | Ho et al. | 438/712 |
| 5,874,011 A * | 2/1999 | Ehrlich | 216/65 |
| 5,883,005 A * | 3/1999 | Minton et al. | 438/707 |
| 5,916,460 A | 6/1999 | Imoto et al. | |
| 6,043,453 A * | 3/2000 | Arai | 219/121.68 |
| 6,203,891 B1 * | 3/2001 | Noddin | 428/209 |
| 6,316,743 B1 * | 11/2001 | Nagahori et al. | 219/121.67 |
| 6,331,208 B1 * | 12/2001 | Nishida et al. | 117/89 |
| 6,456,173 B1 * | 9/2002 | Ella et al. | 333/188 |
| 6,489,590 B2 * | 12/2002 | Livshits et al. | 219/121.84 |
| 6,552,301 B2 * | 4/2003 | Herman et al. | 219/121.71 |
| 6,586,707 B2 * | 7/2003 | Boyle et al. | 219/121.69 |
| 2001/0052917 A1 * | 12/2001 | Hasegawa et al. | 347/61 |
| 2002/0033387 A1 * | 3/2002 | Kurosawa et al. | 219/121.72 |
| 2002/0125227 A1 * | 9/2002 | Sun et al. | 219/121.61 |

FOREIGN PATENT DOCUMENTS

| | | |
|---|---|---|
| EP | 0985484 | 3/2000 |
| JP | 2-92486 | 4/1990 |
| JP | 6-31478 | 2/1994 |
| JP | 2002-9435 | 1/2002 |
| JP | 2002-50849 | 2/2002 |
| WO | WO00/50198 | 8/2000 |

OTHER PUBLICATIONS

Ichikawa et al, Optics Ltrs, vol. 23, No. 14, Jul. 15, 1998, pp. 1138-1140, Linbo3 Platforms for Optical Fiber Alignment.

IBM Technical Disclosure Bulletin, vol. 38, No. 5, May 1, 1995, pp. 607-608, Combined Laser Processing of Vias and Circuitry . . . .

Patent Abstracts of Japan, vol. 10, No. 258, Sep. 4, 1986, and JP61083617A (NEC Corp), Apr. 28, 1986.

IBM Technical Disclosure Bulletin, vol. 18, No. 9, Feb. 1, 1976, p. 3034, Ink Jet Nozzle.

Patent abstracts of Japan, vol. 014, No. 291, Jun. 22, 1990 and JP 02 092486 (Toshiba Corp) Apr. 3, 1990.

Patent Abstracts of Japan, vol. 18, No. 239, May 9, 1994 and JP 06 031478 (Fujitsu Ltd) Feb. 8, 1994.

Patent Abstracts of Japan, vol. 2002, No. 6, Jun. 4, 2002 and JP 2002 050849(Matsushita Electric Ind Co Ltd) Jan. 11, 2002.

Patent Abstracts of Japan, vol. 2002, No. 5, May 3, 2002 and JP 2002 009435 (Sumito Heavy Ind Ltd), Jan. 11, 2002.

* cited by examiner

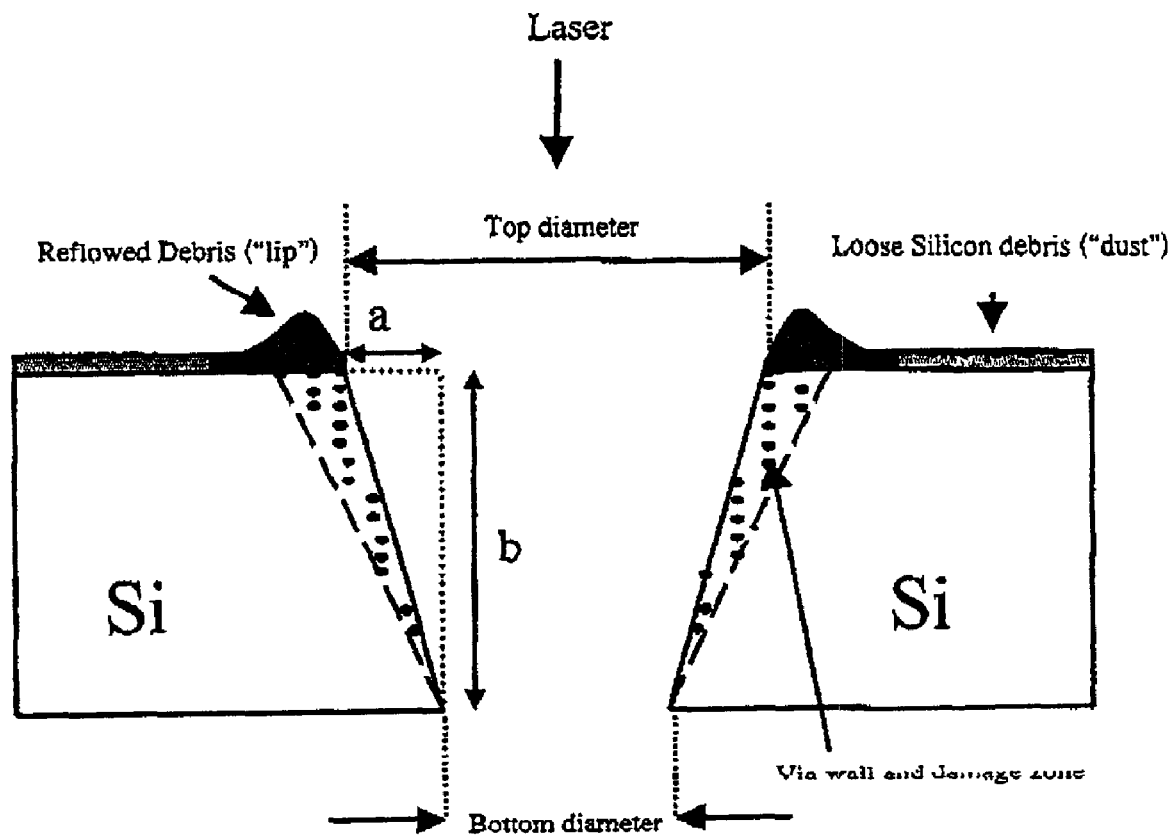
Fig. A
(PRIOR ART)

Fig. B
(PRIOR ART)

Drilling a double-sided via from the second side

LASER MACHINING SYSTEM AND METHOD

The invention relates to laser machining of substrates.

Laser drilling of micro-vias with pulsed lasers may be performed using two methods. In the first method a stationary beam is used (pixel vias): Using this technique a number of laser pulses are delivered to a single point on the substrate. The number of pulses required to reach a certain depth depends on their energy. This technique is suitable for vias smaller than approximately 100 microns diameter. The exact via diameter depends on the laser beam diameter, optical and laser parameters and material properties.

In another method a beam is scanned along the outer profile of the via. This technique is suitable for vias larger than approximately 100 microns diameter. The laser moves in a circular pattern, in one or more concentric circles. Several repetitions might be required to reach the required depth. The via diameter is a function of the radius of the outer circle and the beam diameter. Such a via is referred to as a scanned or trepanned via.

Typically, using a laser beam to machine vias results in several problems. These problems result in the requirement for several post laser machining process steps. Specifically the issues are:

Debris

During the laser drilling process debris on the topside of the wafer is caused by the accumulation of debris and molten material at the via outlet. This is represented in FIG. A. It typically appears in two distinct forms. In one form debris appears as a "lip" of material surrounding the via. The height of the lip can be several tens of $\notin$m. It is believed that one of the processes that may contribute to the formation of the lip is the re-solidification of molten and gaseous material ejected from the via during laser cutting. Typically the debris cannot be removed by conventional washing techniques. An ideal via should have no debris or lip structures.

The second form of debris appears as a "dust" that covers on the top surface of the wafer. Typically this debris can be removed by a simple wash process, however it is more favourable to eliminate the presence of debris completely.

Sidewall Thermal Damage Zone

A second problem that occurs for via drilling is that the accumulated heat in the material increases as the pulse rate, pulse energy and total number of pulses of laser light into the material are increased. At some point the heat dissipated into the surrounding material can cause severe thermal damage to the internal walls of the structure. The impact of thermal damage is to reduce structural integrity due to microcracking and crystal deformation. One technique to reduce this is to chop the beam so as to reduce the total energy delivered to the via. This however reduces the total energy delivered to the surface and is not an efficient technique.

Sidewall Composition

Ultimately the objective of the via drilling process is to achieve an insulated microvia that can be metallized. It is essential that the via is structurally sound and that all reliability criteria can be met. Using conventional techniques it is not possible to control the sidewall material composition or conductivity. To better understand the requirements of the via drilling process the full cycle is described in the next section.

Where an insulating layer is required on the internal walls of a microvia before insertion of a metal interconnect, two additional processes subsequent to machining of the via are required. The first is to clean and smooth the via walls followed by a second process to grow an insulating layer. This three-step process is illustrated in FIG. B. In step 1, a laser is used to machine a via structure with rough tapered walls. A taper within a via is defined as the "slope" of the side wall, which is arctan(a/b) as shown in FIG. A. Step 2 is an cleaning step whereby the sidewalls of the via structure are cleaned. This preferably results in a smooth, high quality finish. In step 3, an insulating layer is created on the internal via walls.

The objectives of this invention are:

To provide a technique for laser drilling of micro-vias where the amount of debris on the topside of the via (the side from which the via is machined) is reduced.

To provide a technique for laser drilling micro-vias where the extent of the internal sidewall heat affected zone within the via is reduced.

To simplify the process of producing a via with desired sidewall morphology, composition and optical and electrical properties.

To achieve greater versatility in use of laser-drilled vias.

To streamline the process of producing high quality via structures with desired internal wall properties into a single step process To reduce the equipment set required in conventional via manufacturing techniques

SUMMARY OF THE INVENTION

According to the invention there is provided a laser machining system comprising a laser source, and a beam delivery system comprising means for controlling delivery of a laser beam generated by the laser source to a substrate to machine the substrate, wherein the system further comprises a gas handling system comprising means for providing a controlled gaseous environment around a machining site.

In one embodiment, the beam delivery system and the gas handling system comprise means for controlling beam pulsing parameters and the gaseous environment to drill a via in the substrate.

In one embodiment, the beam delivery system comprises means for controlling laser pulse energy, laser pulse separation, and number of pulses according to the optical, thermal, and mechanical properties of the material(s) being machined.

In one embodiment, the gas handling system comprises means for controlling proportion of oxygen in the gaseous environment to control or prevent or promote oxide growth as a lining.

In one embodiment, the gas handling system comprises means for controlling proportion of nitrogen in the gaseous environment to control or prevent nitride growth in a lining.

In one embodiment, the gas handling system comprises means for providing a controlled amount of inert gas in the gaseous environment.

In one embodiment, the gas handling system comprises means for introducing into the gaseous environment a gas which has properties for dissociation in the presence of the laser beam to provide etchants or reactants of the substrate.

In one embodiment, the gas handling system comprises means for controlling the gaseous environment to achieve a clean machined wall in the substrate.

In another embodiment, the gas handling system comprises means for controlling the gaseous environment to achieve a desired smoothness in a machined wall of the substrate.

In one embodiment, the gas handling system comprises means for controlling the gaseous environment to enhance removal of debris from the machining site and locality or to reduce the quantity of debris that is generated.

In one embodiment, the beam delivery system comprises means for controlling pulsing parameters to minimise thermal damage to the substrate.

In one embodiment, the laser pulses are not evenly spaced in time.

In one embodiment, the beam delivery system comprises a non-telecentric lens, and means for delivering the laser beam through said lens at an angle to normal to drill a sloped via.

In one embodiment, the beam delivery system comprises means for varying distance of a sloped via entry opening from a beam optical axis to set slope of the sloped via.

In a further embodiment, the beam delivery system comprises means for drilling a via in the substrate and for dynamically varying laser beam parameters as a function of current via depth.

In one embodiment, the beam delivery system comprises means for varying laser beam parameters according to material of the substrate at any particular depth.

In one embodiment, the beam delivery system comprises means for varying laser beam parameters with depth in order to achieve a desired via geometry.

In one embodiment, said varying means comprises means for varying the laser beam parameters to drill a blind via.

In one embodiment, the beam delivery system comprises means for varying laser beam parameters with depth in order to achieve a controlled via diameter at the entrance and exit points on the substrate.

In one embodiment, the varying means comprises means for controlling slope of a taper between the entry and exit openings by varying laser repetition rate, pulse energy, and pulse peak power.

In one embodiment, the varying means comprises means for varying focal spot size to control internal via shape.

In one embodiment, the beam delivery system comprises a telescope, and means for adjusting the telescope to set or dynamically vary beam diameter, plane of focus, and depth of focus to provide a desired via geometry.

In one embodiment, the beam delivery system comprises means for machining the substrate in a plurality of passes, in which each pass machines to a certain stage with a proportion of material removal.

In one embodiment, the beam delivery system comprises means for adjusting the telescope between passes.

In one embodiment, the beam delivery system comprises means for enlarging laser beam focal spot size after drilling a via to cause laser cleaning of debris on the surface of the substrate surrounding the via.

In one embodiment, the gas handling system and the beam delivery system comprise means for controlling laser pulsing and the gaseous environment to provide a controlled insulating lining in a via drilled in a semiconductor substrate.

In one embodiment, the substrate is of Si material and the lining is $SiO_2$.

In one embodiment, the gas handling system comprises a sealed chamber, means for delivery of gases into the chamber and means for pumping gases from the chamber.

In one embodiment, the chamber comprises a window which is transparent to the laser beam.

In one embodiment, the gas handling system comprises means for delivering a halogenated gas to the gaseous environment to remove gaseous debris.

In one embodiment, herein the gas handling system comprises means for controlling gas flow for removal of debris in both gaseous and particulate form.

In one embodiment, the system further comprises means for flipping a substrate, and the beam delivery system comprises means for drilling at locations in registry at opposed substrate surfaces to complete a through via.

In one embodiment, the beam delivery system and the gas handling system comprise means for controlling beam pulsing parameters and the gaseous environment to drill a via having a lining suitable for use as an electrical insulator.

In one embodiment, the beam delivery system and the gas handling system comprise means for controlling beam pulsing parameters and the gaseous environment to drill a via having a lining suitable for use as an optical waveguide cladding.

The invention also provides a laser machining method comprising the steps of delivering a laser beam onto a substrate to machine the substrate, wherein a gaseous environment is provided around a machining site;

the laser beam is pulsed; and the laser beam and the gaseous environment are controlled to machine the substrate to achieve desired properties in the substrate.

In one embodiment, laser pulse energy, laser pulse separation, and number of pulses are controlled according to substrate optical, thermal, and mechanical properties.

In one embodiment, oxygen or nitrogen concentration in the gaseous environment is controlled to control or prevent oxide or nitride growth as a via lining.

In one embodiment, a controlled amount of inert gas is introduced into the gaseous environment.

In one embodiment, a gas having properties for dissociation in the presence of the laser beam is introduced into the gaseous environment, and the dissociated gases etch the substrate.

In one embodiment, the machining is to drill a via and laser beam parameters are dynamically varied as a function of current via depth.

In one embodiment, the laser beam and the gaseous environment are controlled to provide an electrically insulating lining, and the method comprises the further step of filling the via with an electrically conducting material to provide an electrical conductor in the substrate.

In one embodiment, the laser beam and the gaseous environment are controlled to provide an optically opaque lining, and the method comprises the further step of filling the via with an optically transmissive material to provide an optical waveguide in the substrate with the lining as a cladding.

In one embodiment, the laser beam and the gaseous environment are controlled to provide a thermally conductive path, and the method comprises the further step of filling the via with a thermally conductive material to provide a thermally conductive path in the substrate.

In one embodiment, the method comprises the further step of connecting a heat sink to the thermally conductive material in the via.

The invention also provides a laser machining system comprising a laser source, and a beam delivery system comprising means for controlling delivery of a laser beam generated by the laser source to a substrate to machine the substrate, wherein the beam delivery system comprises means for delivering a pulsed laser beam to a substrate; and the beam delivery system comprises means for machining the substrate to an incomplete stage at a plurality of machining sites, and for machining at said sites in at least one subsequent pass whereby there is a delay between machining at any one site as the other sites are machined in a pass.

In one embodiment, the beam delivery system comprises means for changing beam delivery parameters between passes.

In one embodiment, the beam delivery system comprises means for changing beam delivery parameters between passes according to the substrate layer material for a pass.

In one embodiment, the beam delivery system comprises means for changing beam delivery parameters between passes according to desired substrate shape at the machining sites.

In one embodiment, the beam delivery system comprises means for controlling beam delivery parameters between passes to minimise substrate thermal damage.

In one embodiment, the beam delivery system comprises means for controlling beam delivery parameters between passes to reduce deposition of debris.

In one embodiment, the beam delivery system comprises means for controlling beam delivery parameters between passes to achieve a desired substrate geometry at the machining sites.

In one embodiment, the beam delivery system comprises means for controlling beam delivery parameters between passes to drill a plurality of vias in the substrate.

In one embodiment, herein the system further comprises means for flipping a substrate and the beam delivery system comprises means for machining the substrate at machining sites on opposed sides of the substrate in registry to machine a single formation.

In one embodiment, the beam delivery system comprises means for controlling beam delivery parameters to both machine the substrate and to form an electrically insulating lining at the machined site.

In one embodiment, the system also has a gas handling system in which the gas and gas parameters may be changed between subsequent passes.

In one embodiment, the system further comprises a gas handling system comprising means for providing a controlled gaseous environment around the machining site, and the beam delivery system and the gas handling system comprise means for machining a formation in the substrate with or without non-ambient gas in one pass, and for machining at the site in a subsequent pass with a non-ambient gaseous environment to form an insulating lining at the machining site.

The invention also provides a laser machining method comprising the steps of delivering a laser beam onto a substrate to machine the substrate, wherein the beam is delivered to machine the substrate at a plurality of sites in a pass, and to subsequently drill at the same sites in at least one subsequent pass to complete machining at each site.

In one embodiment, a via is drilled at each site.

In one embodiment, beam delivery is controlled to both machine a formation at each site and to provide an electrically insulating lining on a substrate wall at each site.

In one embodiment, a controlled gaseous environment is provided at the machining sites to assist lining growth in a controlled manner.

In one embodiment, the system is used in a manner in which the gas and gas parameters may be changed between subsequent passes.

The invention also provides a laser machining system comprising a laser source, and a beam delivery system comprising means for controlling delivery of a laser beam generated by the laser source to a substrate to machine the substrate, wherein the beam delivery system comprises means for delivering a pulsed laser beam to a substrate at an angle to drill a sloped via.

The invention also provides a laser machining method comprising the steps of delivering a laser beam onto a substrate to machine the substrate, wherein the laser beam is pulsed, and the beam is delivered at an angle to drill a sloped via.

In one embodiment, the via is drilled to interconnect layers in the substrate.

In one embodiment, the via is drilled for conformity with component leads to be mounted on the substrate.

In one embodiment, a plurality of interconnecting vias are drilled.

In one embodiment, the vias are drilled to interconnect at the substrate surface.

In one embodiment, herein the vias are drilled to interconnect internally within the substrate and to each have a separate opening in a substrate surface.

The invention also provides a laser machining method comprising the steps of delivering a laser beam onto a substrate to machine the substrate, wherein the laser beam is pulsed and is delivered to drill a via in the substrate, and the method comprises the further step of filling the via with a thermally conductive material to provide a thermal conductor.

In one embodiment, the method comprises the further steps of connecting a heat sink to the thermally conductive material.

In one embodiment, the method comprises the further step of drilling another via adjacent to said via and filling said other via with an electrically conductive material, and connecting an electrical component to said electrically conductive material.

In one embodiment, the via is a blind via.

In one embodiment, the angled vias are generated in a geometry that allows multiple via contact points on one side of a substrate to a single contact point on the other side of the substrate.

In one embodiment, multiple power inputs and outputs or multiple ground inputs and outputs are consolidated to a reduced number inputs and outputs.

In one embodiment, angled vias are used to reduce the size of a device by allowing connection pads to be placed on the back side of the die.

In one embodiment, the laser source is a solid state diode pumped laser.

In one embodiment, the laser is a frequency multiplied solid state laser.

In one embodiment, the laser is a solid state laser where the laser medium is of the type Host:Impurity where the host is YAG, YLF, Vanadate.

In one embodiment, the laser repetition frequency is in the range from 1 kHz to 200 kHz.

In one embodiment, the laser pulsewidth is less than 200 nanoseconds.

In one embodiment, the laser pulsewidth is less than 10 nanoseconds.

DETAILED DESCRIPTION OF THE INVENTION

Brief Description of the Drawings

The invention will be more clearly understood from the following description of some embodiments thereof, given by way of example only with reference to the accompanying drawings in which:

FIG. A is a diagram illustrating a taper within a via;

Figure 1:
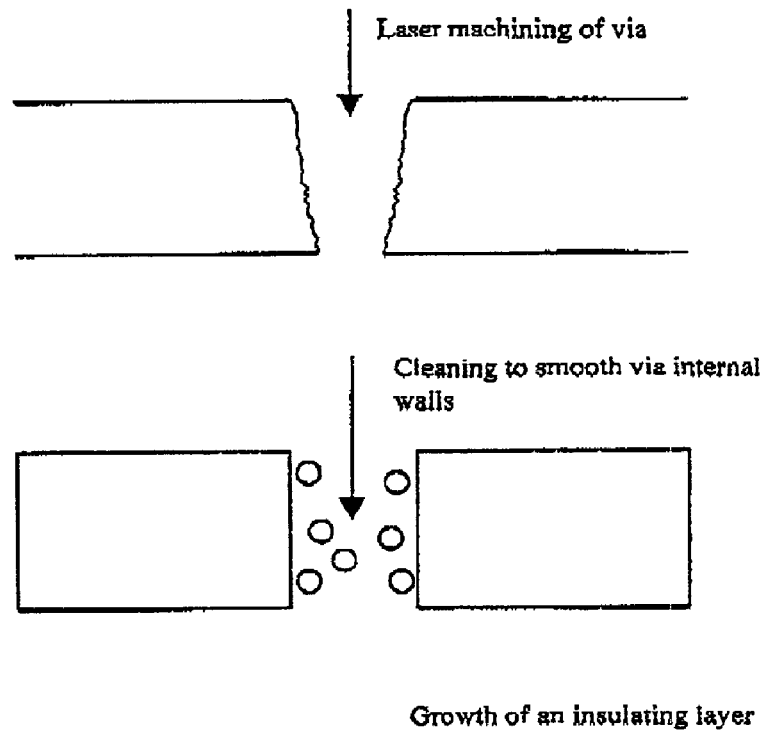
Figure 1:
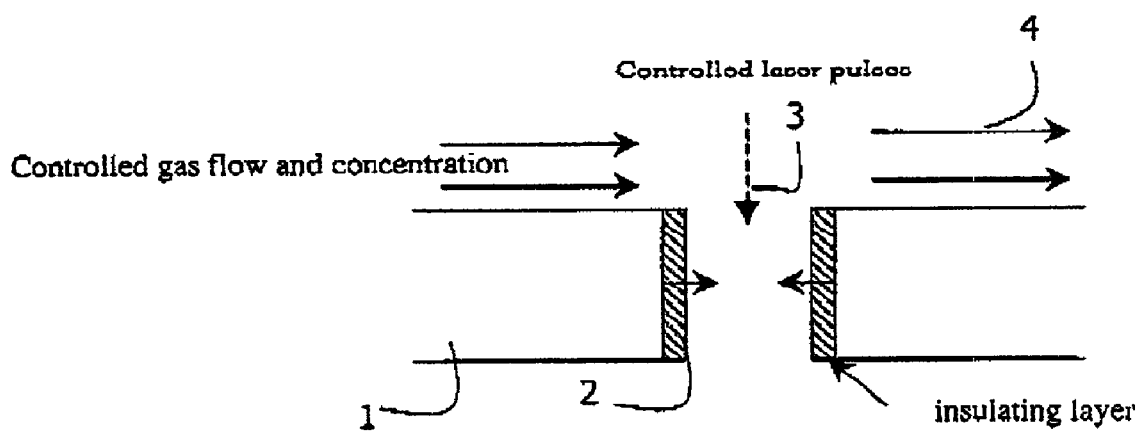
Figure 2:
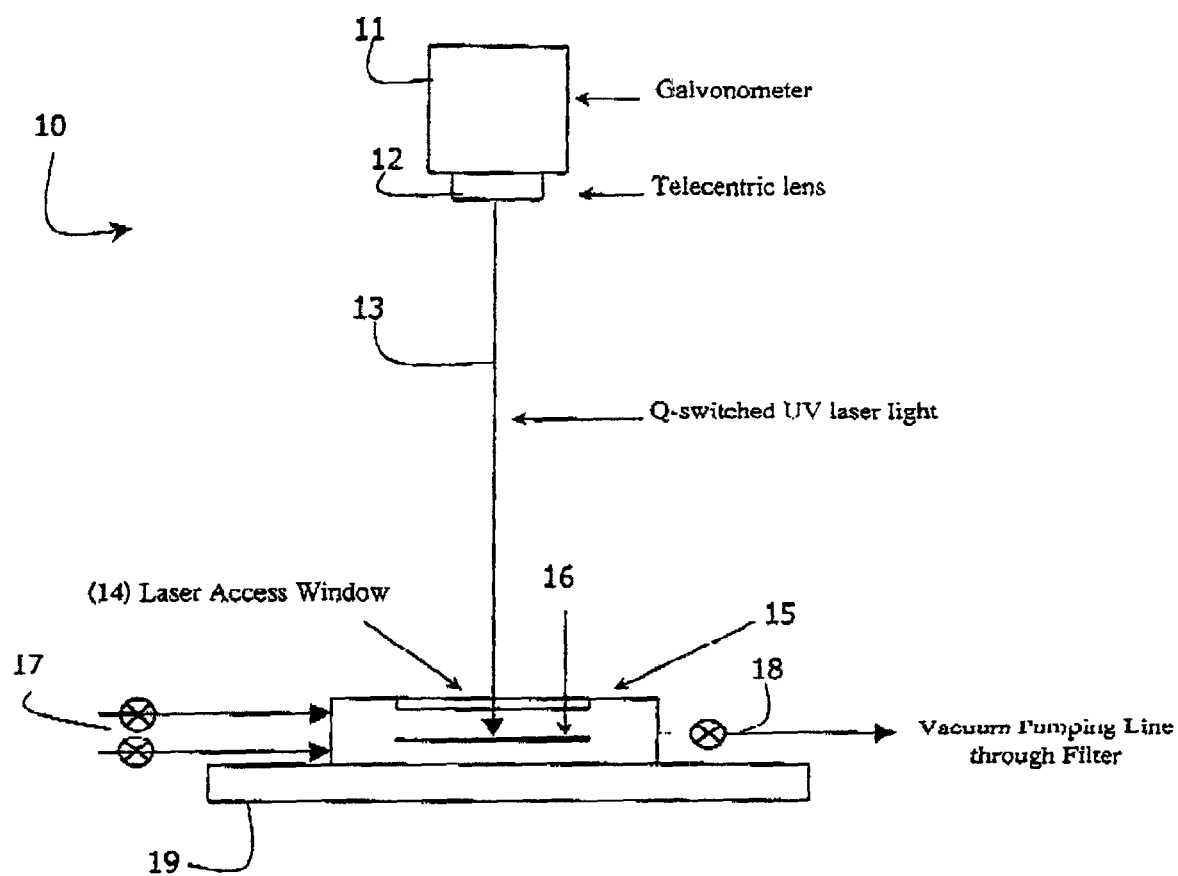
Figure 3:
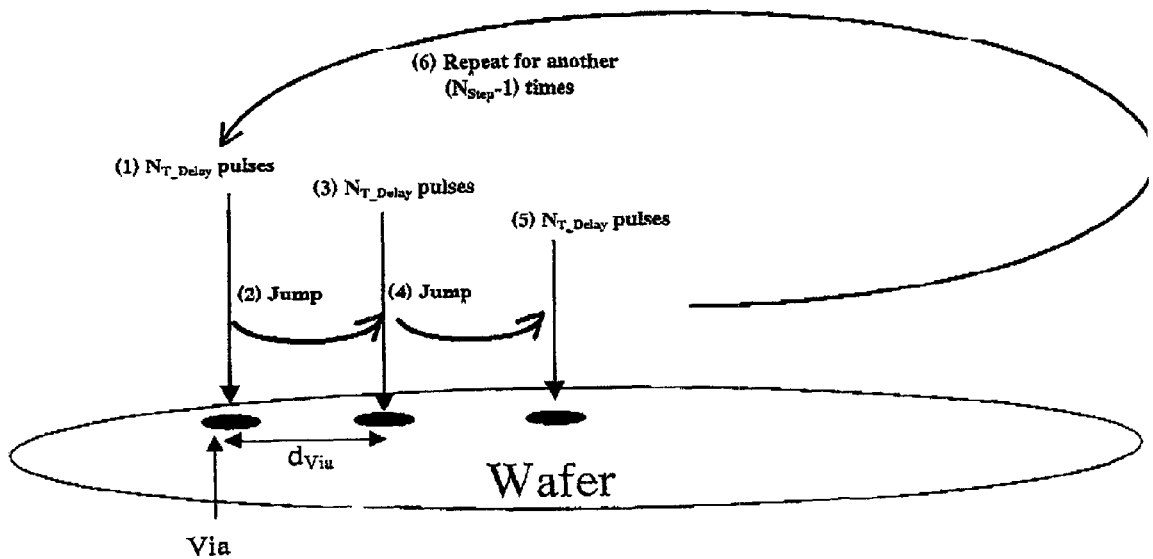
Figure 4:
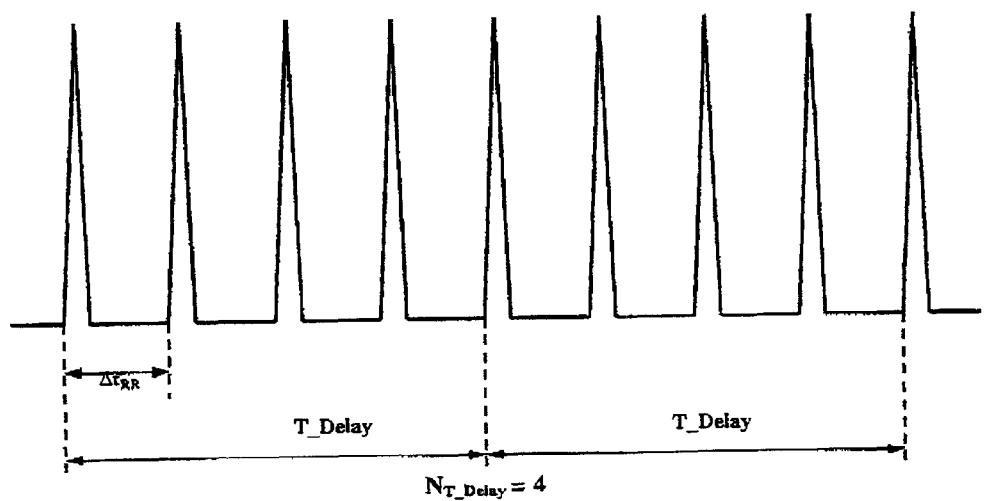
Figure 6:
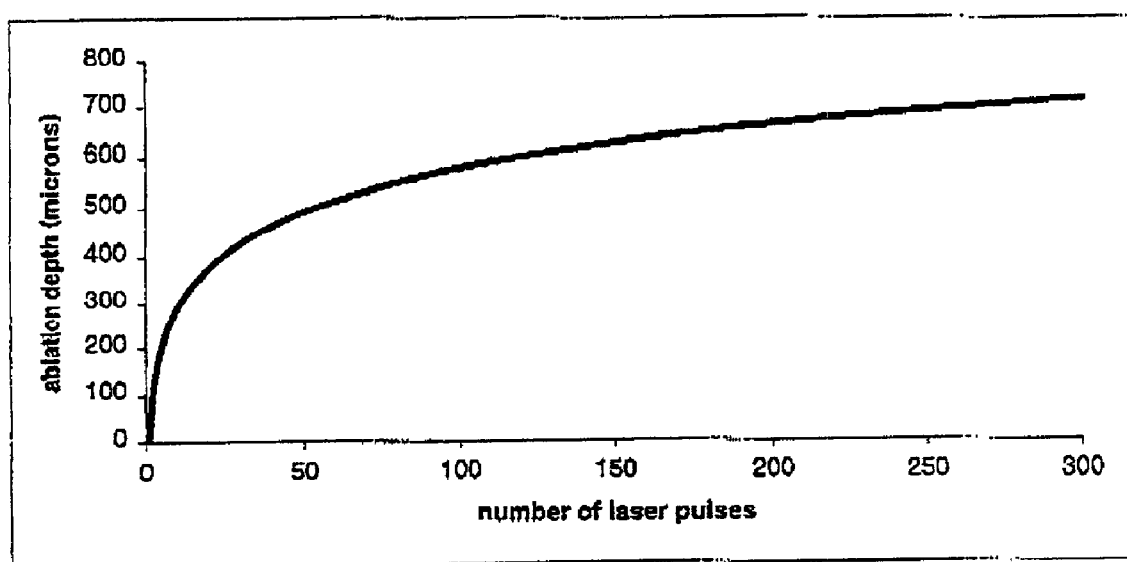
Figure 7:
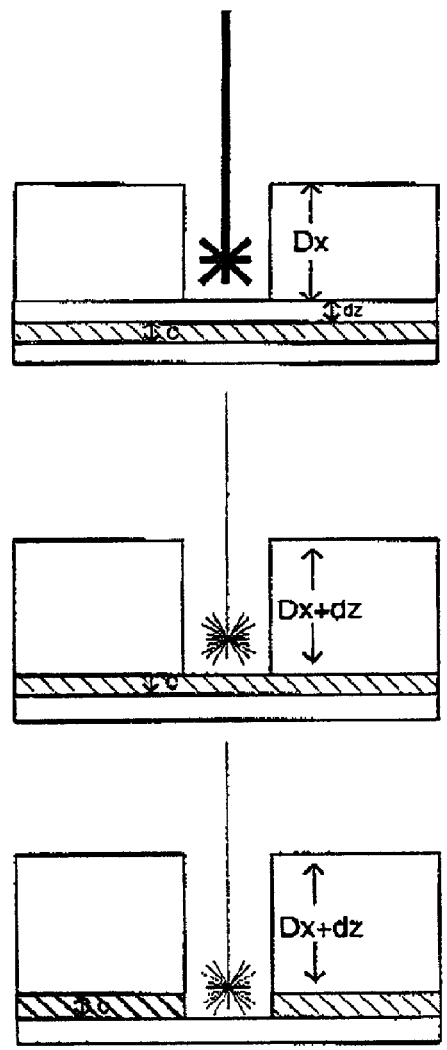
Figure 8:
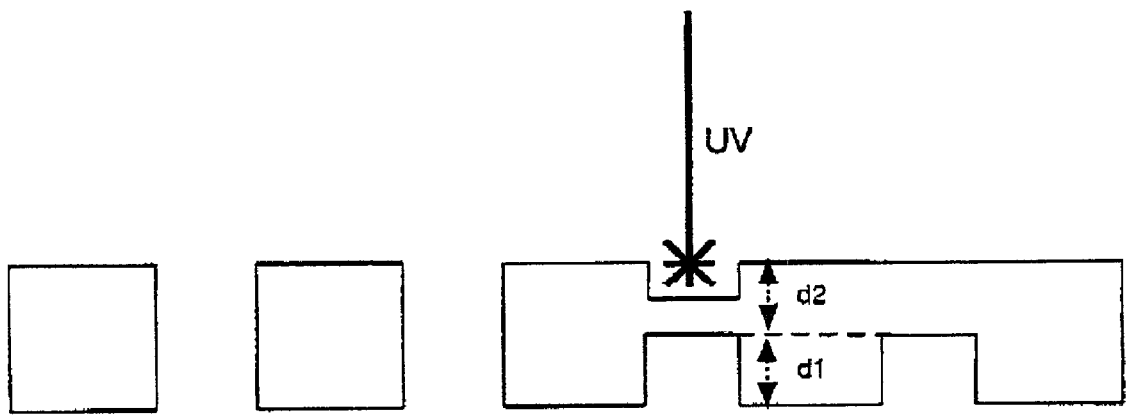
Figure 9:
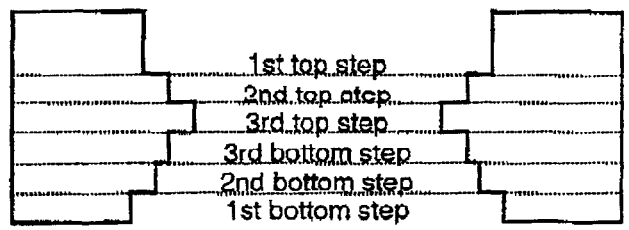
Figure 10:
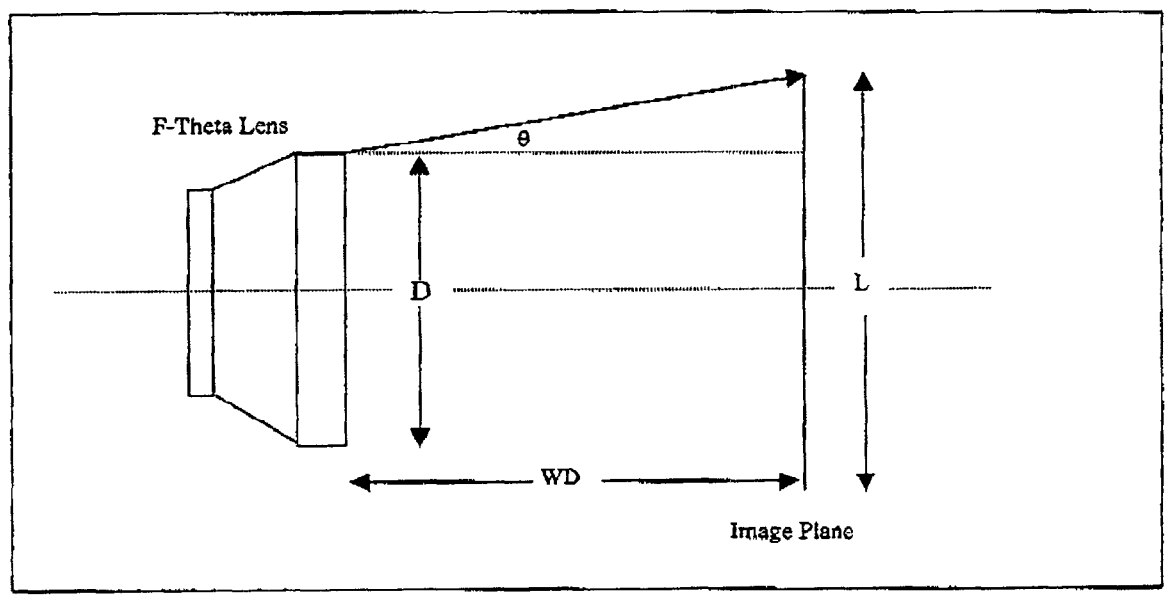
Figure 11:
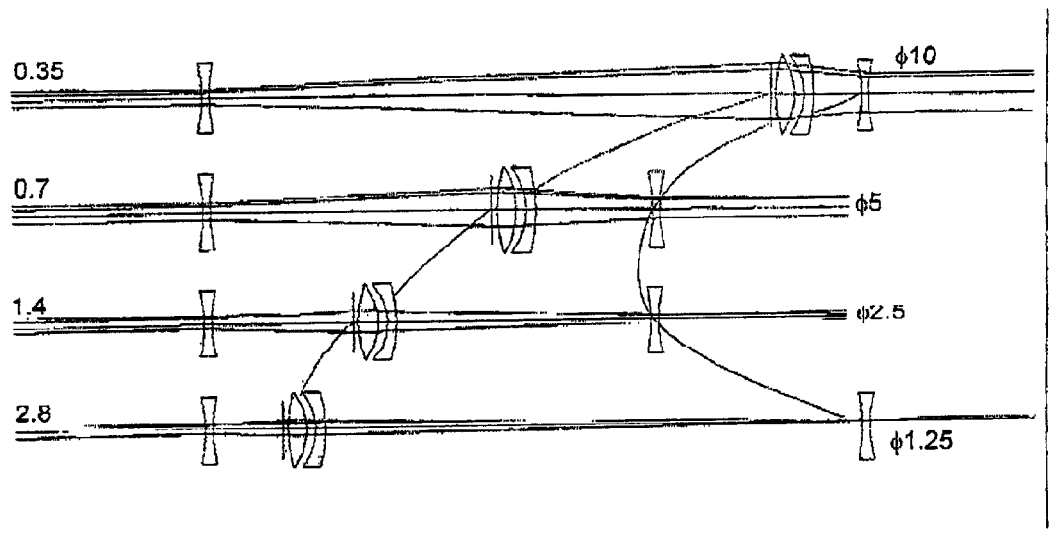
Figure 12:
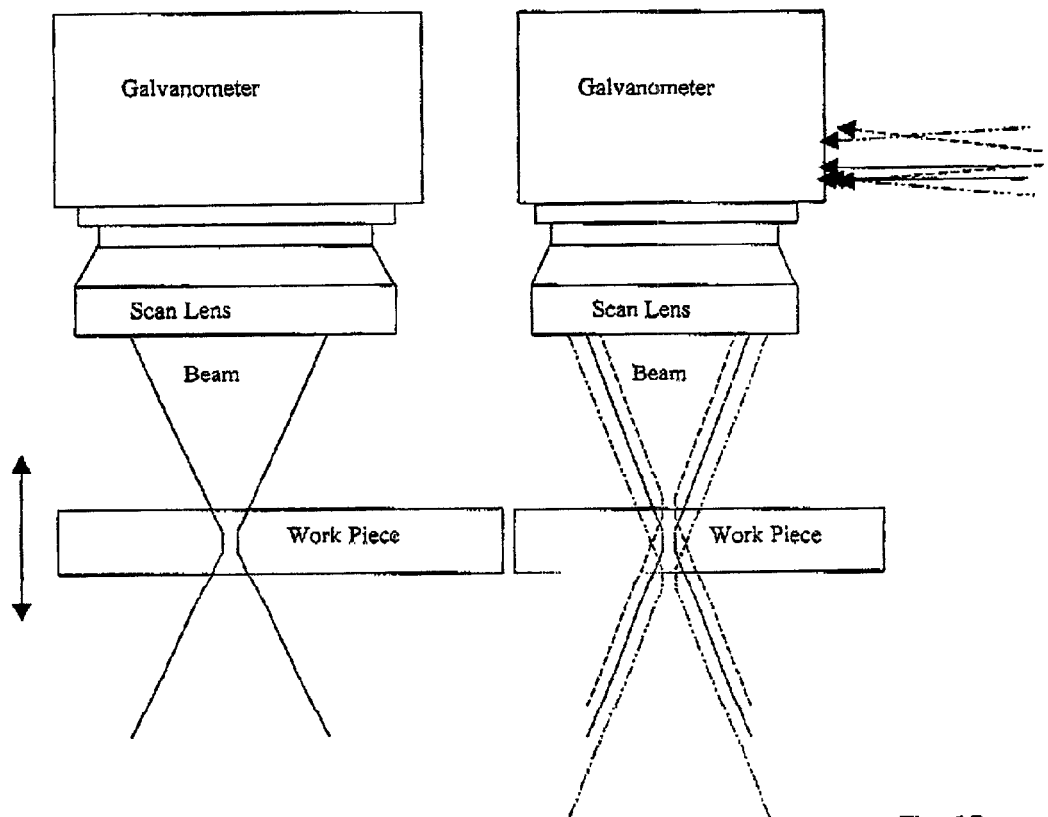
Figure 13:
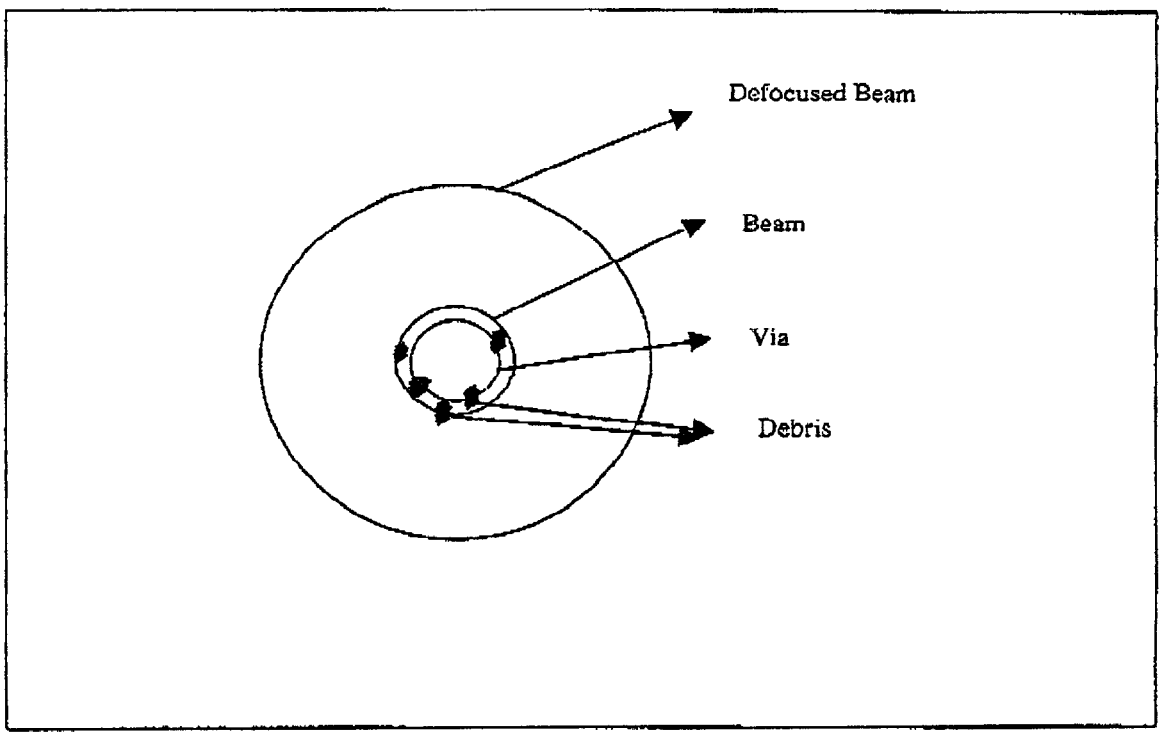
Figure 14:
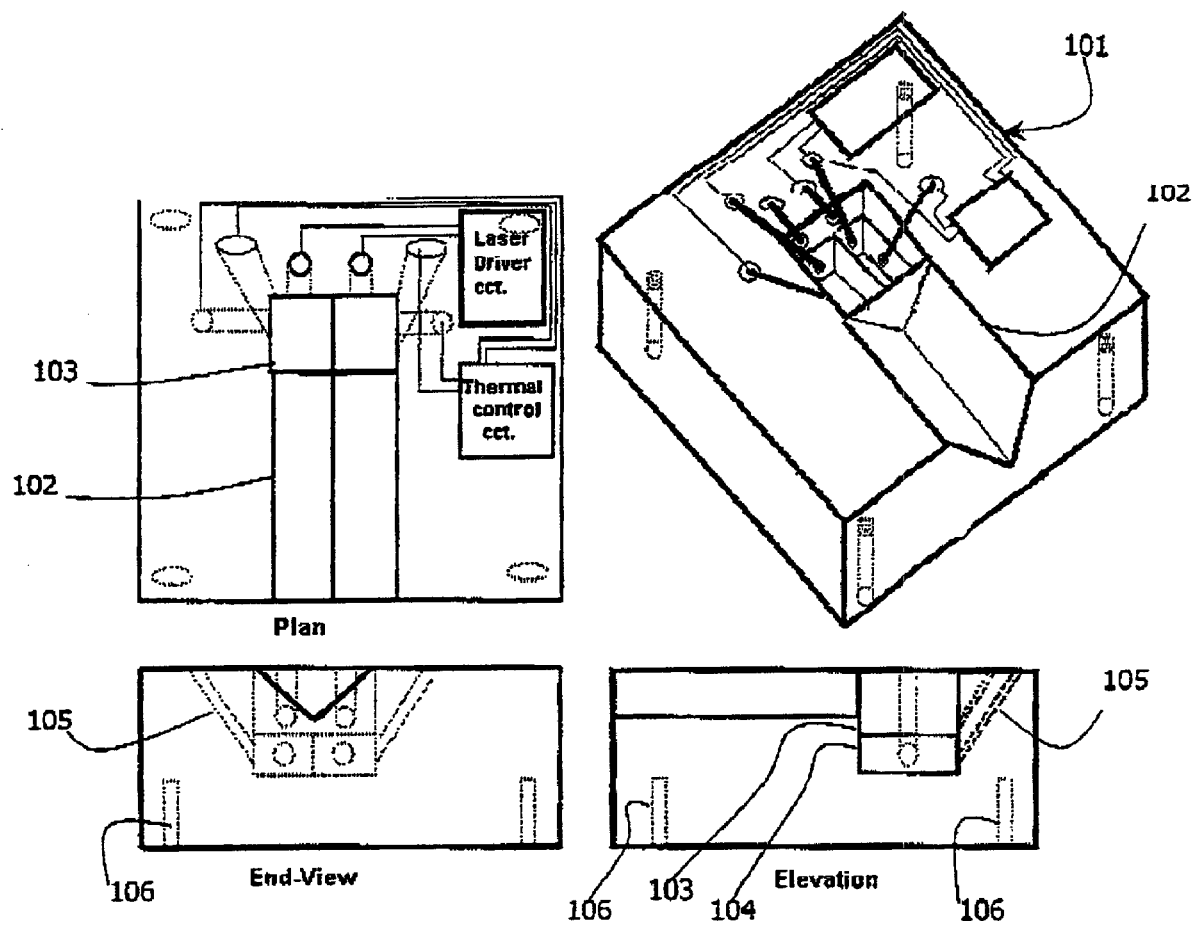
Figure 15:
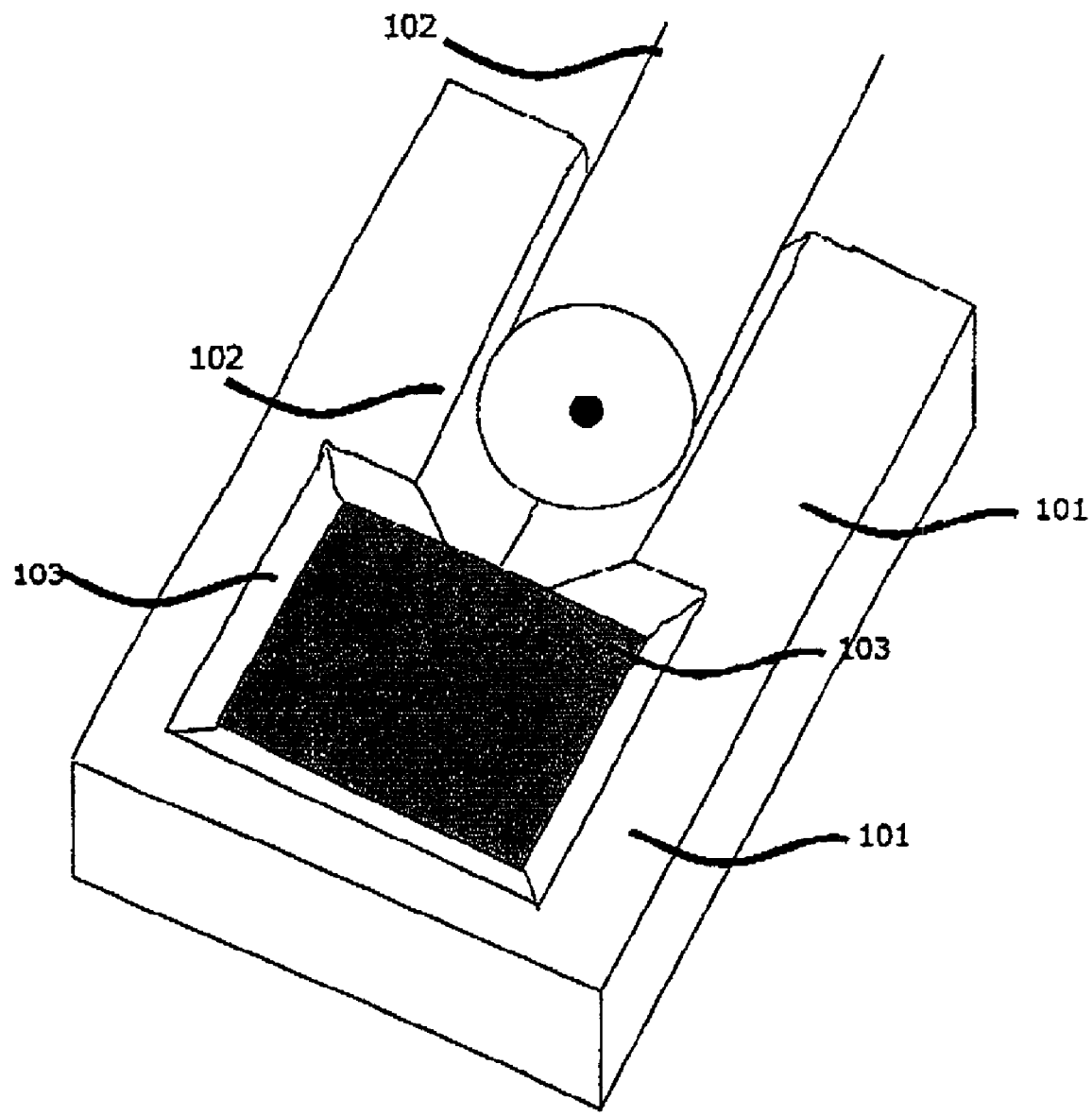
Figure 16:
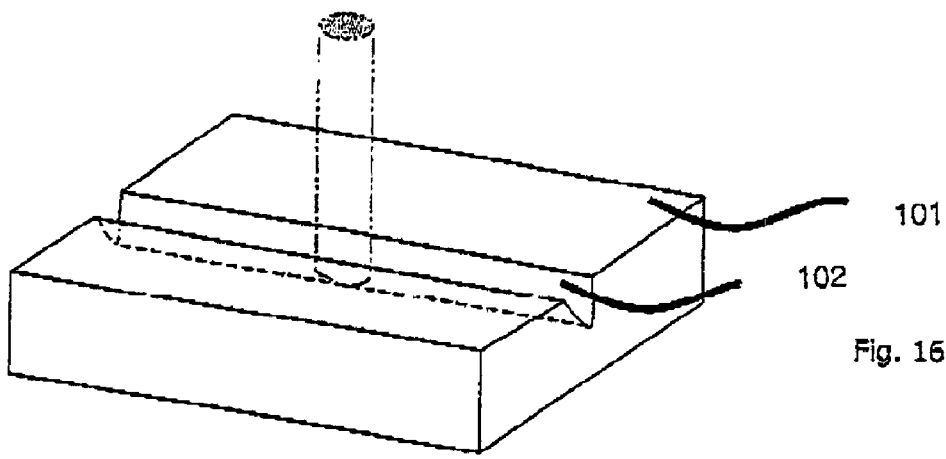
Figure 17:
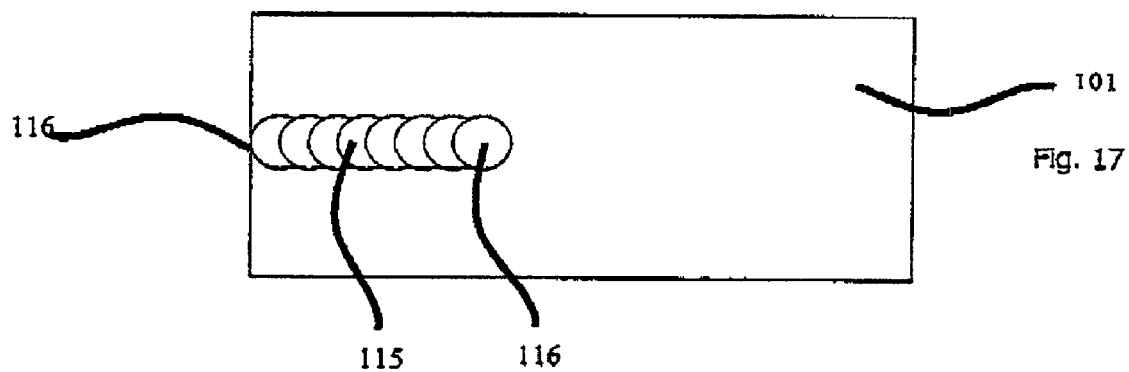
Figure 18:
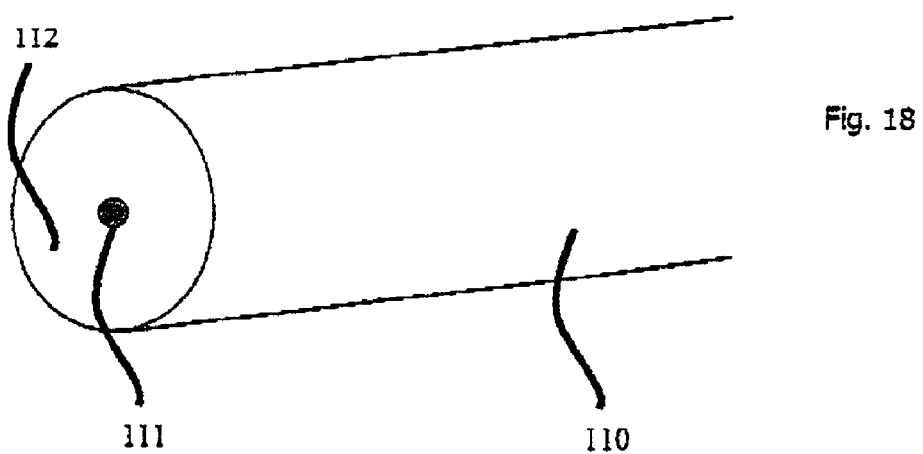
Figure 19:
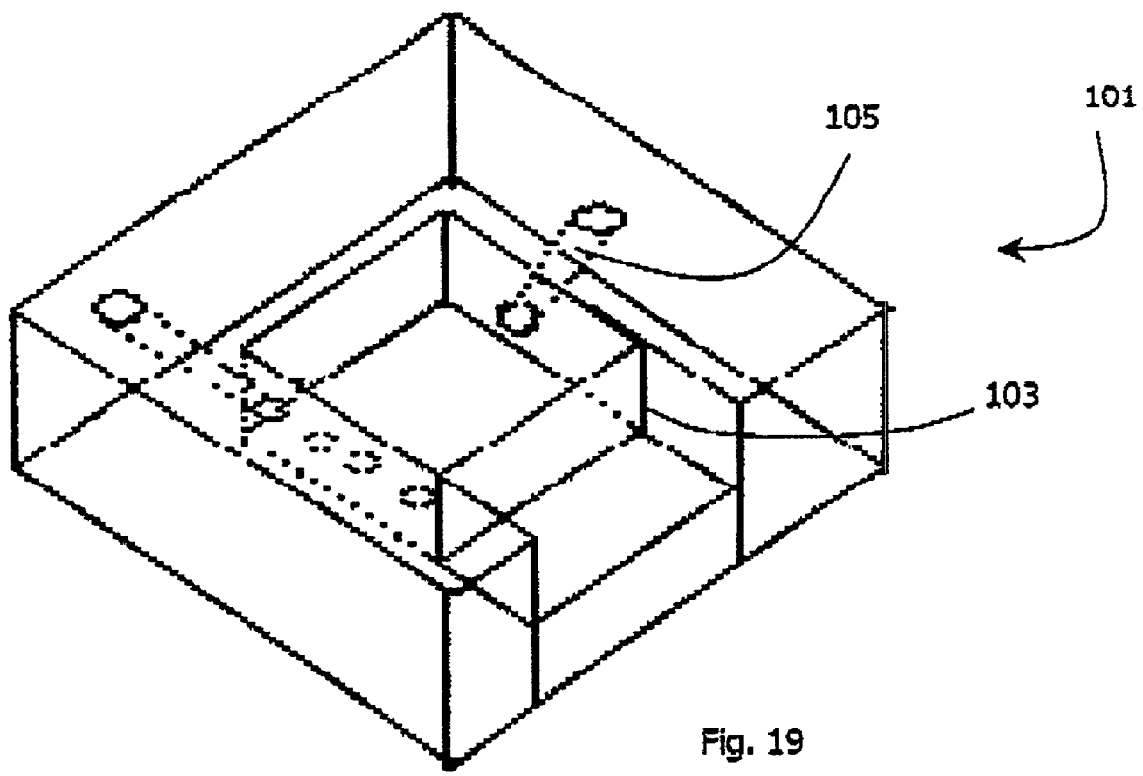

FIG. B. is a diagram illustrating a process to grow an insulating layer;

FIG. 1 is a diagram illustrating laser drilling of a through via according to the invention;

FIG. 2 is a diagram illustrating a laser machining system used for via drilling in a controlled gaseous environment;

FIG. 3 is a diagram illustrating steps for drilling of multiple vias using a multi-step laser process;

FIG. 4 is a plot of a laser pulse train illustrating the variables $\partial t_{RR}$, $N_{T\_Delay}$ and T_Delay;

FIG. 5(a) is a view of the wafer subdivided into rectangles of equal in area to the galvanometer field of view, and FIG. 5(b) is an expanded view of FIG. 5(a) showing a typical galvanometer field of view where $d_1$, $d_2$ and $d_3$ are the distances between via structures;

FIG. 6 is a plot of ablation depth vs. number of laser pulses;

FIG. 7 is a diagram showing drilling through successive layers of a multi-layered substrate using a multi-step laser process;

FIG. 8 is a diagram illustrating drilling of a substrate on both sides to complete a through via;

FIG. 9 is a diagram showing a multi-step laser machining process from both sides of the substrate in order to achieve a profiled via internal sidewall;

FIGS. 10, 11 and 12 are diagrams illustrating optical parameters for laser drilling;

FIG. 13 is a diagram showing the area surrounding a via over which a defocused laser beam is placed for laser cleaning;

FIG. 14 a set of views of a substrate of an opto-electronic component of the invention;

FIG. 15 is a perspective view showing the top surface of the substrate in more detail;

FIGS. 16 and 17 are diagrams showing formation of a V-shaped groove for an optical fibre;

FIG. 18 is a perspective view of an optical fibre;

FIG. 19 is a perspective view illustrating vias in more detail; and

Figure 20:
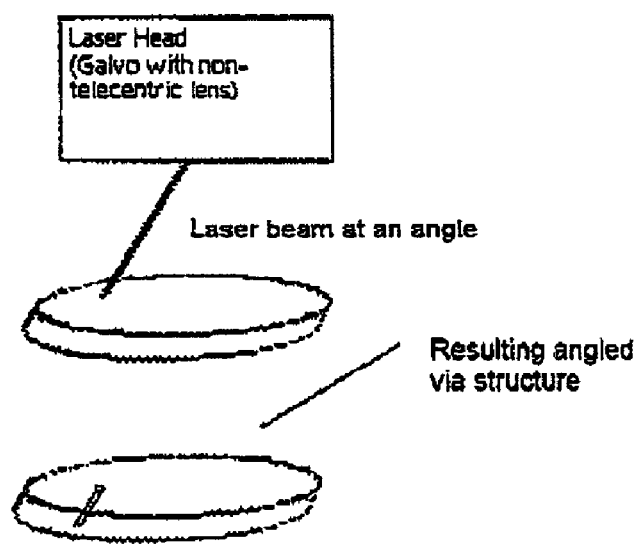
Figure 21:
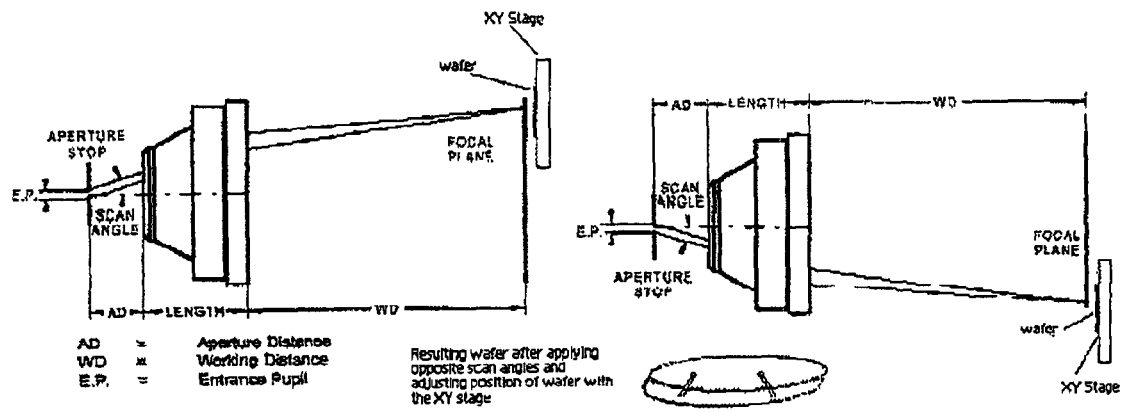
Figure 22:
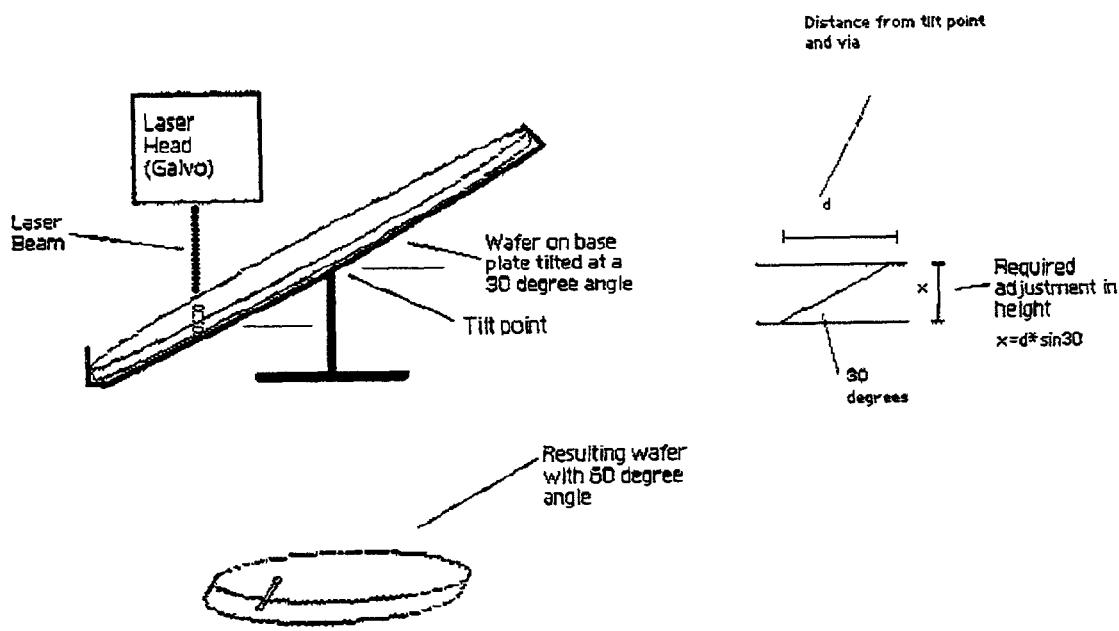
Figure 23:
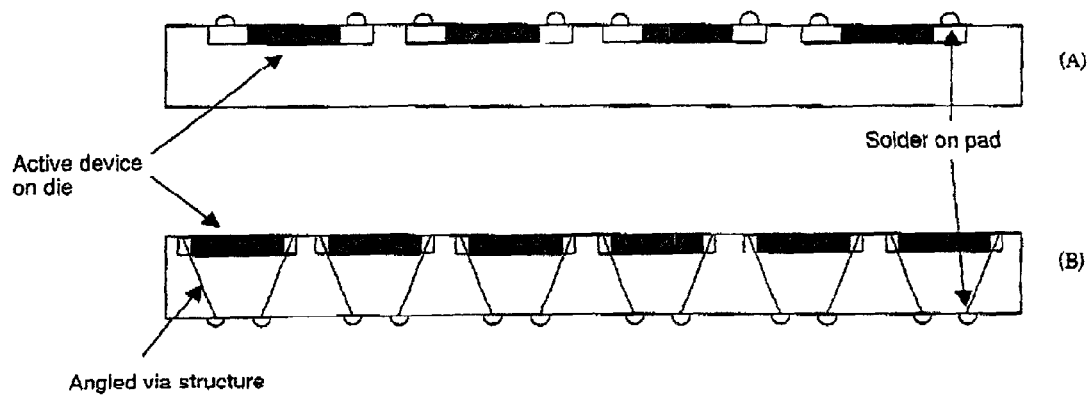
Figure 24:
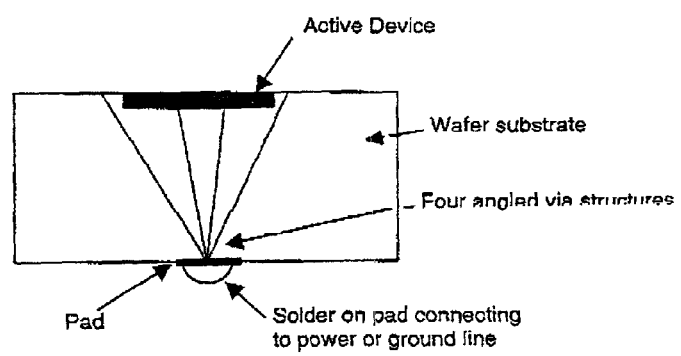

FIGS. 20, 21, and 22 are diagrams illustrating drilling of angled vias;

FIG. 23(A) is a diagram showing conventional location of pads and solder balls on the same side of the die as the active device FIG. 23(B) is a diagram showing the relocation of pads and solder balls on the back side of a wafer that is accessed using laser machined via structures; and FIG. 24 illustrates the connection of four I/O points of an active device to a common ground or common power point on the bottom of a wafer

DESCRIPTION OF THE EMBODIMENTS

A substrate is machined to provide a formation such as a via in the substrate. There is excellent control over the sidewall physical morphology, structural integrity and composition. Also, there is excellent control over the amount and location of debris generated. Also, the invention provides improved versatility for via laser drilling, whereby blind vias, multilayer vias, and angled vias may be drilled in a simple and effective manner.

Before describing the drilling mechanism, the beam pulsing parameters are presented as below:

Machining Speed ($V_{mach}$)

This parameter is defined as the number of vias that can be drilled in each second. The unit of machining speed is the number of vias per second. It is always the intention to optimise this parameter to the highest value, while maintaining acceptable cut quality.

Via Cutting Time (T_Delay)

This parameter is defined as the time the galvo will remain at a particular via position during a given laser machining step. The depth of the via drilled will be proportional to T_Delay. Normally this parameter is optimised to the lowest possible value in order to obtain the highest machining speed ($V_{mach}$) with acceptable via quality. The optimum T_Delay for a via machining process will vary according to the physical properties (such as thermal conductivity) of the material to be machined, plasma expansion/relaxation time, distance between vias, via quality, laser pulse energy and other parameters. A higher T_Delay will typically cause more thermal damage to the via structure.

Single Pulse Period ($\partial t_{RR}$)

This parameter is defined as the temporal distance between laser pulses in a pulse train and is essentially the inverse of laser repetition rate:

$$\partial t_{RR} = \frac{1}{\text{Repitition Rate}}$$

For example, for a laser repetition rate of 45 kHz, $\partial t_{RR} \sim 22$ µs.

Number of Pulses ($N_{T\_Delay}$)

This parameter is defined as the number of pulses to be delivered to a certain via position during a given laser machining step. T_Delay, $\partial t_{RR}$ and $N_{T\_Delay}$ are related to each other by the following expression:

$$\text{T\_Delay} = N_{T\_Delay} \cdot \partial t_{RR}$$

These parameters are depicted in FIG. 4.

Number of Steps ($N_{Step}$)

This parameter is defined as the total number of steps required to machine a single via structure to the required depth. The total number of steps will determine the depth of the via that is drilled.

Density of Vias ($N_{Via/field}$)

Figure 5:
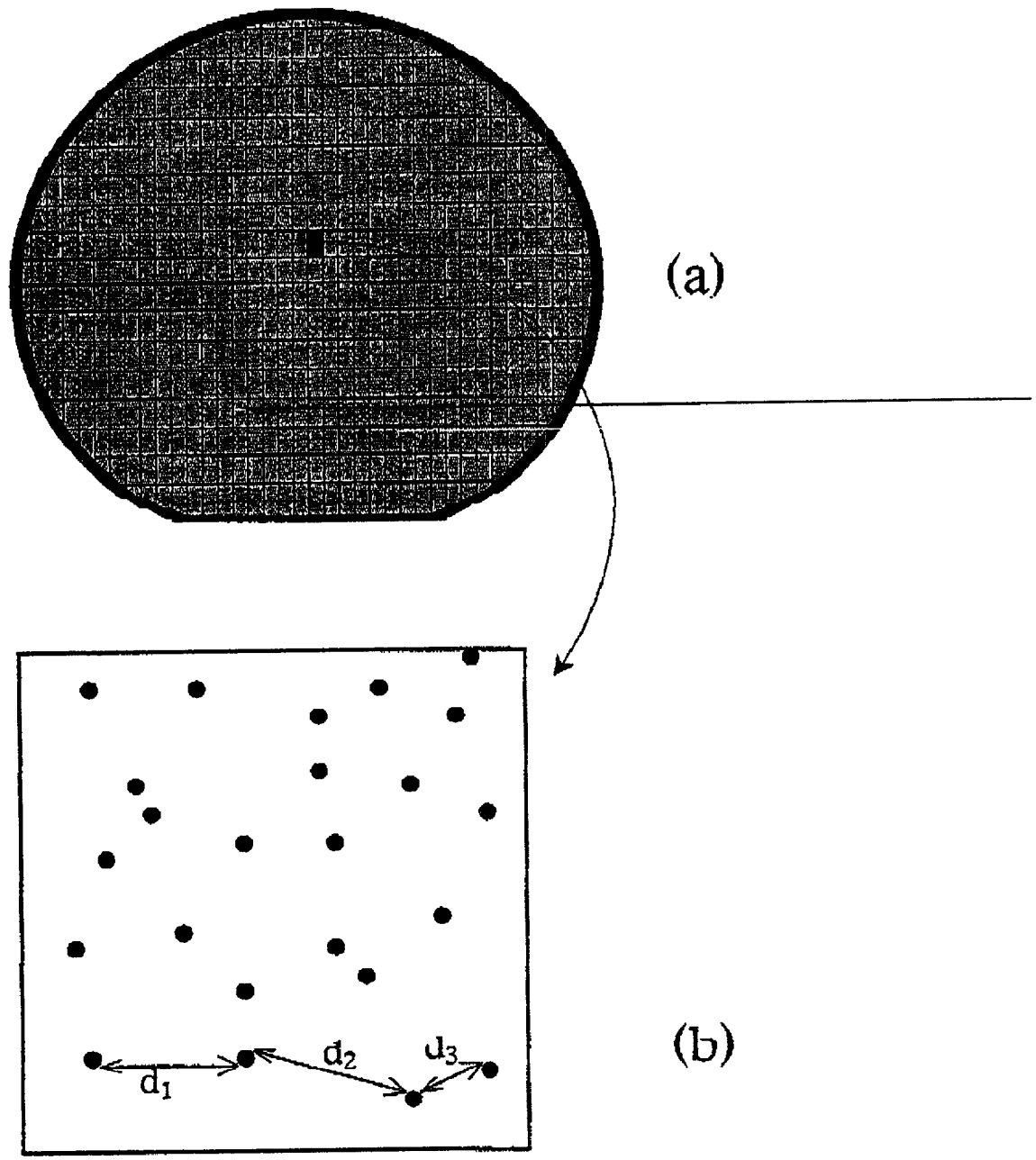

This parameter is defined as the total number of vias within the permitted working field of view of the galvonometer (galvanometer) scanner. $N_{Via/field}$ is illustrated in FIG. 5.

Distance between Vias ($d_{Via}$)

This parameter is defined as the distance between two vias, and normally is different from via to via. $d_{Via}$ is illustrated in FIG. 3 and FIG. 5.

Galvo Jump Speed (J_Speed)

This parameter is defined as the speed of the galvanometer movement between two via structures and is measured in units of meters per second ($ms^{-1}$). A higher value of J_Speed results in an increase in machining speed.

Jump Delay (J_Delay)

This parameter is defined as the settling time for the galvanometer after moving to a new via position. If J_Delay is too short this will result in a "spiking" laser line around the via due to insufficient time for the galvanometer mirrors to settle following movement from one via to the next. However, a long J_Delay will result in a lower machining time. A higher galvo jump speed (J_Speed) normally requires a higher jump delay (J_Delay), and hence the optimisation of these two parameters is essential in order to obtain the highest machining speed with acceptable cut quality.

Optical Parameters

Beam Diameter

Beam diameter refers to the 1/e squared diameter of the spatial intensity profile of the laser. In via machining, the diameter of the via is a function of the beam diameter. Beam diameter is a variable that can be controlled through selection of the focusing lens, scanlens or beam telescope. The effect of modifying beam diameter is to modify the power density level at focus.

Peak Power Density (Intensity)

This parameter is defined as the peak power per unit area, where the peak power is the energy per second.

$$\text{Peak Power Density} = \frac{E}{\partial t \nu A}$$

Where E is the energy in Joules, ∂t is the pulse width in seconds and A is area in centimeters squared and the peak power density is in Watts per centimeter squared.

Energy Density $$\text{Energy Density} = \frac{E}{A}$$

This parameter defined as the energy (E) in Joules divided by the area (A) in centimeters squared. The unit of energy density is Joules per centimeter squared.

Depth of Focus

The depth of focus for focused beams of second, third and fourth harmonic YAG, YLF and Vanadate type lasers is larger than in multimode lasers and in lasers with large M squared values. This is primarily due to the fact that the spatial output from YAG, YLF and Vanadate type laser systems is Gaussian. A large depth of focus is highly advantageous for via machining in thick wafer substrates, as generally the wafer thickness is such that it can be placed at a fixed distance from the working lens without repositioning to compensate for defocusing effects. However, under certain circumstances, the beam may require certain defocusing in order to improve the wall quality or taper angle within the via.

Formation of Through Hole Micro-Vias

Referring to FIG. 1 a substrate 1 is drilled with an insulating layer on the via side-wall 2 by controlled laser pulses 3 and/or a controlled gas flow 4. A substrate is defined as a workpiece to be machined, which may include but is not limited to wafers and other semiconductor, electronic or optoelectronic device. This substrate may consist of a single material, or a combination of materials including, but not limited to, a layered structure consisting of a single material or multiple materials, and these materials may or may not be patterned.

Combining the control of laser pulses and gas flow or using just one of these individual processes will enable machining of vias with significantly reduced debris and significantly reduced sidewall thermal damage. For example a smooth, high quality internal wall surface and a low degree of via taper can be produced using a multi-step laser machining process whereby a controlled number of laser pulses (with variable inter-pulse separation and pulse energy) are delivered to the substrate within a certain time period. This reduces thermal damage to the via sidewalls, thus resulting in smooth internal side-walls.

A laser controller controls the laser pulse energy, inter-pulse separation and the number of pulses per laser machining step on the basis of the optical, thermal and mechanical properties of the material to be machined, the machining depth within the substrate material and also the laser type to be used.

A gas handling system controls the gaseous environment. In one embodiment, the environment includes photo-activated etchants of the substrate material. The oxygen concentration in the environment is selected to remain constant or to vary during machining of the via structure, thus promoting growth of an oxide layer on the internal via walls during laser machining. Control of the oxygen concentration or the concentration of oxygen containing gases (e.g. $CO_2$) permits control of the oxide layer thickness required for electrical insulation of a typical metal interconnect inserted into a via machined in a silicon substrate.

Referring to FIG. 2 a laser machining system 10 comprises a galvanometer 11 and a telecentric lens 12 providing a Q-switched UV laser beam 13. The beam 13 is directed onto an access window 14 of a cleanroom chamber 15 containing a wafer 16 to be drilled. The system 10 comprises gas inlets 17 and a vacuum pumping lines 18 for the chamber 15. The chamber 15 is mounted on an X-Y translation stage.

Laser light enters the window 14 of the gas reaction chamber 15, which is capable of withstanding pressures of up to 10 bar. Alternatively, this chamber can be evacuated to typical pressures in the region of 0.1 bar for machining at pressures below atmosphere. Different gases are introduced into the chamber 15 by the series of mass flow controllers 17, which permit control of the relative gas concentrations in the chamber 15 for laser machining in a static gas environment. Also, the mass flow controllers 17 and 18 on the inlet and vacuum outlet lines permit control of the flow rate of different gases for machining in a non-static gas environment.

The vacuum exhaust line 18 permits evacuation of the chamber 15 below atmospheric pressure and is also used to vent waste gaseous products produced during the laser machining process. A filter connected to the vacuum line permits filtering of unwanted waste products and recycling of unused gases. A detector connected to the chamber 15 permits measurement of the relative and absolute concentrations of parent gases and by-products produced during laser machining.

Smooth internal via walls are achieved by varying the laser pulse energy and the inter-pulse separation at different steps throughout the multi-step process used to machine a single via structure. This permits control of thermal loading in the substrate to be machined, thus preventing excess damage of the via side walls due to thermal stress.

Also, introduction of fluorocarbon gases (e.g. $CF_4$) into the chamber 15 during machining of the via structure results in reduced debris machining as photo-dissociated fluorine assists in silicon removal in a gaseous form. Other photo-activated gases used in low debris machining of silicon in the gas reaction chamber include, but are not limited to, chlorofluorocarbons and halocarbons.

By combining the above two process, a superior quality via can be achieved.

Laser machining of via structures in an inert gas environment such as helium and argon permits suppression of oxide growth on the internal via side-walls for applications requiring non-insulating side-walls. The introduction of nitrogen into the gas reaction chamber during machining permits growth of the insulating material silicon nitride on the internal via side-walls for applications requiring non-insulating side walls.

Following laser machining, a layer is formed on the internal side-wall of the via structure. This layer is formed when substrate material, melted during laser machining, re-solidifies upon cooling. Through suitable choice of gas mixes, their flow rates and their relative concentrations the stoichiometry, microstructure and other properties of this layer can be altered so as to produce a side-wall with electrical and/or optical properties best suited to the desired application. Gas mixes include: Active (e.g. $O_2$, $CO_2$)+Inert gases (e.g. He, Ar) for control of oxide growth in the via internal side-walls, Nitrogen+Inert gases (e.g. He, Ar) for control of nitride growth in the via internal side-walls, Active (e.g. $O_2$, $CO_2$) or Nitrogen+Etchant gas (e.g. chlorofluorocarbons, halocarbons) for control of oxide or nitride growth in the via internal side-walls with reduced surface roughness and reduced debris inside and outside the via structure.

Multi-Step Micro Via Machining

FIG. 3 shows the basic operation of a multi step via machining strategy. In this strategy, the laser beam stays at a single via position for a certain predetermined period of time (i.e. T_Delay) and will then be moved to another via position. The laser beam will then move back to the first via position after it has finished cutting the last via. This procedure is repeated another ($N_{Step-1}$) times. One purpose of the 'multi' step approach is to reduce the heat affected zone (HAZ) within the via, which is believed to contribute to debris and to downgrade the side-wall quality of the via. Also, by changing the laser pulse and beam properties at different steps in a multi-step process, mulitlayer structures consisting of different materials can be efficiently machined during each step.

Machining Speed ($V_{mach}$)

The machining speed as a function of other laser processing parameters can be derived as follows:

For a given galvanometer field of view as depicted in FIG. 5.

$$\text{Time required to cut a single step for a via} = T\_Delay$$
$$= N_{T\_Delay} \cup \ni t_{RR}$$

$$\text{Total time required to cut a single step for all vias to be machined } (t_1) = N_{via/field} \cup T\_Delay$$

$$t_1 = N_{via/field} \cup N_{T\_Delay} \cup \ni t_{RR}$$

The total jump distance of the galvanometer for a single cutting step=the total distance ($d_{Via}$) travelled by the galvanometer for $N_{Via/field}$ number of vias $$= \int_{i\,l}^{i\,N_{via/field}} d_{Via}$$

The total galvanometer jump time required to machine a single step for $N_{Via/field}$ number of vias ($t_2$)

$$= \frac{\int_{i\,l}^{i\,N_{via/field}} d_{Via}}{J\_Speed}$$

The total galvanometer setting time during machining of a single step for $N_{Via/field}$ number of vias ($t_3$)
=J_Delay$\cup N_{via/field}$ The total time required to complete a single via drilling step for $N_{Via/field}$ number of vias
=$t_1 + t_2 + t_3$ Assuming all the beam parameters are remain unchanged throughout all the process steps, the total time required to complete all via drilling steps in a multistep process for a single galvanometer field of view is
=$N_{step} \cup (t_1 + t_2 + t_3)$ $$\text{The number of vias drilled per second (i.e Machining Speed or } V_{mach}) = \frac{N_{via/field}}{N_{Step}\cup(t_1\ t_2\ t_3)} \quad (1.1)$$

$$= \frac{N_{via/field}}{N_{Step}\cup\left[N_{via/field}\cup N_{T\_Delay}\cup \ni t_{RR} \; \clubsuit\; \bullet\; \blacklozenge\; \frac{\int_{i\,l}^{i\,N_{via/field}} d_{Via}}{J\_Speed} \; \div\; J\_Delay\cup N_{via/field}\; \blacklozenge\; \div\; \heartsuit\; \neq\right]}$$

From the expression (1.1) above, it is clearly indicates that one of the critical parameters that determines the machining speed is $N_{Step}$, i.e. the lower the $N_{Step}$ the higher the machining speed. Since the total number of pulses that is required to machine a via is constant at a certain thickness of the machined material, one of the possible ways to reduce $N_{Step}$ is to increase the number of pulses fired ($N_{T\_Delay}$) in each step. However, an increase in $N_{T\_Delay}$ may introduce thermal damage in the via structure due to the fact that a higher number of pulses is directed on each via at each instant. These two parameters are optimised in order to obtain the highest machining speed with the best via quality.

Expression (1.1) also shows that the machining speed is proportional to J_Speed but inversely proportional to J_Delay. A higher J_Speed (hence higher machining speed) requires a longer J_Delay (i.e. higher galvanometer setting time), which will in turn reduce the overall machining speed. For a given substrate material and laser type, these two parameters are optimised in order yield the highest machining speed.

As shown in expression (1.1), another parameters that determines the machining speed is the laser repetition rate, i.e. the higher the repetition rate, the lower the $\ni t_{RR}$ and hence the higher the machining speed. This can be understood as more pulses is delivered to the via in higher repetition rate which will increase the overall machining speed. However, a laser pulse operated in higher repetition rate may result in a lower average power due to the natural characteristics of the laser. Furthermore, a higher repetition rate also has the potential to cause more thermal damage on the side wall as more pulses are delivered to the via in a shorter period. For a given type of laser, this parameter is optimised to yield the highest machining speed with the best via quality.

Expression (1.1) also shows that the machining speed is inversely proportional to the total distance between via $$\left( \text{i.e.} \int_{i\ 1}^{i\ N_{Via/field}} d_{via} \right),$$

i.e. the longer the distance, the lower the machining speed. As part of this invention a software algorithm has been developed to determine the most 'effective' (i.e. shortest) distance travelled by galvanometer for a given set of via distributions within the galvo field in order to obtain the highest possible machining speed.

EXAMPLE 1

In a process of drilling 1000 vias in a galvo field of 15 mm υ15 mm at a laser repetition rate of 55 kHz, using two pulses on each via and 50 machining steps, for a jump speed of 5 m/sec and a jump delay of 50 ∉s. The total distance between all the vias is ~0.48 m.

The machining speed can be estimated as below:

$$\ni t_{RR} = \frac{1}{55000} = 18.19 \Pi s = 18.19 \upsilon 10^{-6} \text{ sec.}$$

$N_{Via/field}$=1000
J_Speed=5 m/sec
J_Delay=50 ∉s=50υ$10^{-6}$ sec
$N_{T\_Delay}$=2 (for 2 pulse on each step)
$N_{Step}$=50

$$V_{mach} = \frac{1000}{50 \overset{\triangle}{\Leftrightarrow} 1000\upsilon 2\upsilon 18.19\upsilon 10^6 \ \blacklozenge \ \frac{0.48}{5} \ \heartsuit \ \div \ \neq \ 50\upsilon 10^6 \upsilon 1000 \ \approx}$$

~110 vias/sec.

The above example describes a specific case where the laser pulse parameters remain unchanged throughout the multi-step process. However, if the laser pulse properties such as inter-pulse separation ($\ni t_{RR}$) and the number of pulses per step ($N_{T\_Delay}$) change from step to step, the denominator of equation (1.1) need to be replaced by the total sum of t1, t2 and t3 for each step.

Formation of Blind Microvias

Through-hole micro-vias enable connectivity between top and bottom surfaces of a substrate However, in certain applications where it is not required that the via structure is completely drilled through the substrate material, a blind via is formed. An example of an application requiring such a via type is where conductive layers lie within a semiconductor or dielectric stack and it is necessary to drill partially through the wafer down to the conductor without defacing or damaging the conductor. In this specific example of the via drilling process the metal is unharmed and retains its integrity, the debris produced during machining does not block the conductive path, and the via is fully drilled through to the metal or conductor.

An example of a structure like this is shown in FIG. 7. As an example the top layer may be crystalline silicon of thickness Dx+dz, below it is a copper layer of thickness c and below it is another layer of silicon.

In one embodiment of the invention it is required to drill a via down to the level of metal, without damaging the metal. In that instance, the via is drilled to depth Dx using normal via machining parameters. To drill to the metal layer the laser power, repetition frequency and pulse energy may be modified to remove the thickness dz at a slower rate. This ensures that excess energy is not dissipated in the conductive metal layer and that a clean contact is left to the top of the metal thin film. Additionally, performing this machining process in the presence of a photo-activated etchant gas or/and multistep process will aid this process.

In another embodiment it is required to drill though the copper at this point, without damaging the underlying silicon layer. In that case the above two steps are repeated, and then the laser drilling parameters are altered again so to drill through the copper without damaging the underlying silicon.

In a further embodiment the semiconductor structure may be a stacked structure of semiconductor, dielectric (e.g. polymer, quartz, glass) and/or metal materials. Depending on the layer the via drilling parameters (pulse separation, pulse energy, average power, laser foal spot size etc.) may be modified to ensure optimised machining through each layer of the multilayer structure. Modifying the parameters in this way ensures that defects such as de-lamination, melting and debris are minimised.

Control of Via Depth and Shape

When drilling vias through a semiconductor, the ablation depth increases logarithmically with the number of laser pulses. This is represented approximately for silicon in FIG. 6. In summary, machining vias in thin wafers is exponentially faster than in thicker wafers. This data is true if the via drilling parameters are held constant.

A second impact of the above observation is that the taper of the microvia is dependent on the laser parameters used to machine the via. Specifically, peak power and average power.

To improve the removal of material at points deeper in the substrate it is beneficial to modify the laser parameters so that pulses with higher peak power are used. This approach enables more efficient removal of material in deeper vias and also enables control of the micro via taper.

In a further embodiment, the via may be formed by first machining from one side of the wafer to a depth d1 and by flipping the wafer and drilling to a dept d2 in registration with the via on the other side of the wafer, the complete via of depth d1+d2 may be drilled. This is represented in FIG. 8. The effect of this is to eliminate taper and ensure that top and bottom diameter are identical and also, as the depth of machining is faster for thinner wafers (or for reduced depth vias) the total number of pulses required is significantly less than in the case of drilling from one side.

Another embodiment of the invention relates to scanning the beam in a circle or series of concentric circles with a specific offset. This method is particularly useful for larger diameter vias where the power density would be too low to be efficient in a direct pixel via machining approach. Using the techniques involving gas ambient control and correct delays the via quality of a scanned via is improved greatly. Also the sidewall morphology and composition can be accurately controlled in this manner. Finally, using multiple steps in the depthwise direction, the scanned via taper can be controlled to form a nozzle. A schematic of this approach is illustrated in FIG. 9. This is not limited to purely circular vias. Elliptical via profiles are also possible through a scanning beam machining process.

Formation of Angled Vias

Aside from straight through vias and blind vias a further embodiment of the invention is the formation of angled vias. The benefits of angled vias include moving topside wafer bump connections to the backside of the wafer, reducing topside area required for connectivity and the ability to connect from topside or bottom-side to a point at the edge of a micromachined side wall structure to enable contact with an embedded device.

The logical approach to laser drilling micro-vias at an angle is to tilt the substrate with respect to the optic axis. In practice this is not easy to implement as it will be difficult to maintain a constant working distance between the lens and the work surface. Only along the axis of tilt can this distance be maintained, with either side either nearer or further from focus. While oscillating the tilt will have the effect of widening the via without giving it any preferred angle in space.

Over a 6" wafer a tilt of as little as 10° will introduce a vertical displacement of 26 mm at the periphery and even over a 10 mm square area the vertical displacement will be 1.74 mm which is significantly outside the depth of focus of all but the longest scanning lenses.

To be used in such an instance would require automatic refocusing of the beam over the field of view to compensate for the different relative displacements of the work surface from the scan lens. This also can be achieved by moving the vertical position of the wafer depending on the distance of the machining site from the axis of tilt.

In one embodiment of this invention a non-telecentric lens is used to form angled microvias. Such a lens is depicted in FIG. 10. The lens diameter is D and the diagonal of the Field of View is L. Since the lens is non-telecentric the emergent beam is not orthogonal to the optic axis (except when incident along the optic axis) and the largest available deviation angle is T, which is $\arctan((L-D)/2*WD)$. For a typical non-telecentric F-theta lens with a Working Distance of 188 mm, a lens diameter of 90 mm and a Field of View diagonal of 140 mm the maximum deviation angle is 7.6°.

The available range for angled vias is then, for this particular lens, between 0 and 7.6°. By employing appropriate lenses other ranges may be achieved between 1 and 14°.

The range of angles available is determined by the scan angle of the galvanometer and the lens specification. To achieve control of angle requires that the wafer position can be controlled relative to the object field point at which the beam forms that angle relative to the normal angle of the optical system. This can be achieved by an X-Y table positioning system synchronised with galvanometer and laser.

Variable Focus During Via Drilling

Zoom Telescope

Due to the finite depth of focus of the F-theta lens the via diameter may change with propagation depth through the substrate, something which may be undesirable. To mitigate this a variable focus system may be employed that will have the effect of modifying the focused spot position during the drilling process. Such a system utilises a zoom telescope in conjunction with the scan lens. The telescope permits the spot size at focus to be adjusted automatically between 5 and 50 µm. An example of the optical configuration is shown in the schematic of FIG. 11.

The telescope and scan lens system are constructed such that the collimation of the beam upon exiting the telescope is tailored to permit the scan lens come to a focus at any position within 5 mm of its nominal working distance. This is illustrated in the graphic of FIG. 12. Automation and software control integrated into the machining environment makes this method a highly reliable and sophisticated solution to the problem of maintaining precise control of via aspect ratios. It is significantly easier than drilling some way into the vias, stopping, changing the focus manually by adjusting the galvanometer/scan lens position and then completing the via.

In one embodiment of the invention the available via diameters may be configured to be between 5 and 200 µm by adjusting the zoom telescope to an appropriate setting permitting a wide range of sizes to be achieved.

In a further embodiment the speed of drilling can be increased by adjusting the collimation of the zoom telescope to bring about different focus positions within the workpiece, ensuring a consistent spot size through the body of the via.

In a multi-step process the diameter of the via may be adjusted at each processing step permitting a precisely controlled via profile.

In a further embodiment the incident beam may, by defocusing the telescope, be enlarged to a degree such that the incident intensity is less than the ablation threshold for the workpiece but higher than the cleaning threshold permitting explosive cleaning of the surface in the vicinity of the via entrance. This is depicted in FIG. 13.

In another version of the invention the sidewall of each via can be cleaned as a final processing step by directing a beam of lower power into the via and traversing the sidewalls, thereby removing debris and improving the quality of the finished surface.

Through appropriate adjustment of the main laser parameters such as the pulsewidth, pulse energy and repetition rate, beam size and divergence the taper angle of the via may be controlled.

Another embodiment of this invention is to control the wafer vertical position relative to the beam waist at each step in the multi-step process. Variation of the vertical position relative to the waist has the effect of modifying the beam size at each step. This is analogous to controlling the plane of focus for a fixed beam diameter.

The following summarises features of the invention.

Producing high quality microvia structures in semiconductor and insulator materials by means of a multi-step laser machining process.

Producing high quality microvia structures in semiconductor and insulator materials by means of a controlled gaseous environment permitting control of the internal wall morphology and material composition of the microvia structure.

Producing high quality microvia structures in semiconductor and insulator materials by means of both a controlled gaseous environment and a multi-step laser machining process.

The laser pulse energy, laser pulse separation and the number of laser pulses per machining step are selected based on the substrate optical, thermal and mechanical properties, the laser type and the depth within the substrate.

A controlled amount of oxygen or an oxygen-containing gas is used in a gas reaction chamber during laser machining in order to promote controlled oxide growth on the internal walls of the microvia structure.

A controlled amount of an inert gas is used in a gas reaction chamber during laser machining in order to suppress the growth of an oxide layer on the internal walls of the microvia structure.

A gas, upon photo- or thermal-dissociation in the presence of the machining laser beam, produces by-products that are etchants of the substrate to be machined, thus permitting cleaner machining of the microvia structure and reduction of debris at the microvia entrance and exit and on the internal walls.

A gas, which is naturally reactive with by-products of the laser induced material removal preventing deposition of reacted species.

A multi-step laser machining process is used to control the thermal loading in the substrate material thus preventing thermal shock leading to cracking and damage to the internal microvia walls.

A microvia structure with a diameter in excess of 100 microns is machined by scanning of the laser beam in a pattern comprising of a series of concentric circles.

A microvia structure with a diameter less than 100 microns is machined using a laser beam held in a fixed position on the substrate surface.

The focal spot size of the laser beam is altered using an automated beam telescope during machining of the microvia structure in order to define the internal side-wall contour.

Subsequent to machining of the microvia structure the focal spot size of the laser beam is increased so as to permit laser cleaning of the debris field on the surface of the substrate surrounding the microvia entrance aperture.

The laser focal spot is scanned through the substrate material during machining of the microvia structure by adjusting the collimation of an automated beam telescope resulting in control of the internal side-wall contour of the microvia structure.

A sloped microvia structure is drilled at an acute angle by tilting the wafer with respect to the beam.

In one embodiment, the microvia is drilled at an acute angle with respect to a substrate surface using a non-telecentric lens thus permitting access to a device within the substrate, thereby allowing a layered component architecture and also allowing tighter geometric positioning of components.

A series of sloped microvia structures are machined from a common entrance aperture on one side of a substrate to the same or different depths in the interior or to the bottom of the substrate, thus permitting electrical connection of multiple points in the substrate with a common point on the substrate surface following insertion of conducting material into the microvia structures.

A series of sloped microvia structures are machined from one side of a substrate to connect with a common point in the interior or on the other side of the substrate, thus permitting electrical connection of multiple points in the substrate surface with a common point on the substrate interior or on the other site of the substrate following insertion of conducting material into the microvia structures.

A via is drilled through the substrate to electrically interconnect opposed sides of the substrate.

A via is drilled as a blind via or through via to facilitate thermal contacting and heat dissipation.

The substrate is of silicon material and the insulating lining is of $SiO_2$.

The laser beam has a wavelength in the VIS-UV range.

Example of Application of the Invention

In recent years there have been major developments in production of integrated electronic components. However, because of the mechanical requirements for positioning of items such as waveguides and optical sources and detectors automation of production of optical components has not been achieved to any significant extent.

This invention enables device structures that simplify manufacturability of such components.

For example an optical component may be produced by:
providing a substrate;
etching a trench in the substrate using a laser beam; and
mounting an optical device in the trench.

The method comprises the further steps of laser drilling vias to provide electrical conductors. Additionally, the capability to machine a sloped via drilled at an angle with respect to a substrate surface for access to a device within the substrate allows a layered component architecture. The benefit of such a structure is that multiple contact pads on one side of the wafer or substrate can be connected to a single pad or trench on the opposing side of the wafer or substrate. As described previously the system allows formation of an Si/SiO2 or alternative insulating lining on the via.

Referring to FIGS. 14 and 15, a substrate 101 for an optical component is illustrated. The substrate is a Silicon Optical Bench (SiOB). The substrate 101 comprises a V-shaped groove 102 and trenches 103 and 104 for an optical source and associated Peltier thermal control elements. Sloped microvias 105 are laser drilled to reach the trenches for electrical connection. Laser drilling is also used to create mounting holes 106. Also, through vias (not shown) are drilled through the substrate for electrical access of one side to the other.

In the drawings, an optical fibre is indicated by the numeral 10, in which there is a core 111 and cladding 112. The etching progress is illustrated in FIG. 17, in which a spot pattern 116 is illustrated.

The use of angled (sloped) vias allows layering of layered components in which components are placed one above the other, while still making required electrical contacts. This allows increased component density. One architecture is placing of electrical circuits on the substrate surface and optical devices within the substrate body.

An aspect of the laser via drilling is that by appropriate control of the drilling parameters and gases such as oxygen an insulating lining is inherently created. Thus the solder which is filled into the vias is insulated from the surrounding semiconductor material without the need for adding a discrete insulating lining. Thickness of the insulating lining can be controlled by suitable control of the laser parameters and gas environment. In one embodiment, the laser beams are UV or visible, for example 355 nm/266 nm UV systems and 532 nm Green laser systems and having a repetition frequency greater than 1 kHz.

Referring to FIGS. 20 to 22, the methods by which the sloped vias are drilled is illustrated. As shown in FIGS. 20 and 21, a non-telecentric lens is used to direct the output from a galvanometer laser head.

Referring to FIG. 22, an alternative method is to tilt at an appropriate angle using a tilt stage. It may be necessary to adjust the height of the wafer to ensure the depth of focus is correct. However if the wafer can be tilted about the particular point where the via is to be formed this adjustment of height may not be necessary. i.e. the required change in depth is simply the distance of the via from the tilt point times the sine of 90θminus the required angle for the via.

Referring again to FIGS. 14 to 19, there are angled vias whose entrances are on the top of the wafer and which exit in the chamber where the laser will be placed. The laser is on its side allowing for the electrical connects. A chamber beneath the laser is created for a thermistor and the whole system is placed on a peltier. The laser is placed in the chamber and then appropriate electrical material is placed in the trench ensuring that safe clean contacts are made with the laser without causing damage to it. The 'ground' trench could be placed to the right of the chamber with the appropriate electrical material helping to keep the laser chip stable.

The laser sources for drilling and etching are second and higher order harmonic frequency solid state lasers operating with high pulse energies and nanosecond pulse widths. Implementation of the invention is possible with shorter pulse width lasers but central to the high throughput aspect of this invention is that the laser must operate at a high repetition rate.

The following are advantageous features of the invention.

The formation of V-grooves on an integrated optical chip (IOC) used for optical fibre alignment by laser ablation, using, for example an Nd:Yag frequency tripled or quadrupled laser. Where SiOB is the objective, 355 nm and 266 nm are particularly useful. Where LiNbO3 and insulating substrates are used 266 nm (or fourth harmonic) lasers are the preferred option.

The formation, by laser ablation, of component slots or trenches for alignment and/or housing of, for example laser diode chips or photodiode chips represent examples of blind vias.

The formation, by laser ablation of through-vias on an integrated optical chip (IOC) to allow electrical contacts from one side through to the other side of a wafer.

The formation, by laser ablation, of sloped or angled through-vias where typically the vias start at the top (or bottom or side) of the wafer and will exit in a trench allowing for precise electrical connections to a particular component to be placed in the trench. In the case of silicon, with a specific set of laser parameters, the via side wall composition may be controlled to consist of glass like silicon dioxide. The composition and structure of this oxide may further be controlled by the presence or absence of a gas and the laser parameters. For example removal of oxygen from the ablation reaction will reduce the amount of SiO2.

In another embodiment, the microvia enables formation of an optical waveguide through connection. The waveguide structure is defined by a cladding and a core region. In this example the cladding is formed partially by control of the laser machining parameters and gas environment so that a glassy layer is formed on the internal via side-wall. The optical waveguide can then be formed through filling the via with appropriate plastic or glass material with sufficiently high transmission to form an optical waveguide through via.

Example of Application of the Invention

Angled vias can be of use for shrinking the size of a die, especially in the case of die which have active devices and pads on the same side and which have comparable areas of the die utilized by the pads and the devices. This is of particular interest for these cases where the devices have a low number of I/O connections, but can still hold true for die with a larger number of I/O connections where the edges of the die contain the majority of the pads (edge-leaded die).

In one embodiment of the invention, the device would exist on one side of the die with its position roughly centered on the die face (see FIG. 23). The I/Os are distributed around this device. Vias are drilled from the contact locations on the device to a series of pads. Instead of using pads which extend outward from the device to the edge of the die as in FIG. 23A, the vias are metallized (or otherwise made into conduction paths), and pads are now formed on the back of the die as in FIG. 23B. The angle of the vias allows for the I/Os to be positioned all the way in to the center of the die backside, allowing for uniform population of the surface of the back of the die.

Now that the device is the only feature on the front side of the wafer, the die size may be significantly reduced (by the area which was previously taken up by the bond pads). This not only allows for smaller die and smaller package sizes, but also allows more die to be created on the same wafer during wafer fabrication. While the first of these benefits is primarily a product feature benefit (smaller die, less real estate wasted in the final device), the latter one has the potential to significantly reduce the manufacturing costs incurred in wafer fabrication for making these devices (the same number of die can be made on fewer wafers).

In a further embodiment of the invention that is specific to this example the vias don't necessarily have to be angled, particularly when there is a small number of I/O connections from the active device. In this instance, straight vias can be machined from the contact locations on the device through to pads located on the backside of the die. Vias at the edge of the die will connect to pads on the bottom side of the die that can be patterned in towards the centre of the die, thus maintaining the footprint of the active device from the top to the bottom of the die and thereby still permitting an increased number of active devices on the front side of the wafer.

In a further embodiment of the invention, angled vias can be useful for redistribution of I/O connections on a die. In a typical bumped die, approximately a third of the I/O connections are for either power or ground. When these leads go out to the package, all the grounds are connected together and all the power leads are also connected. Only the signal leads need to remain independent. As such, angled vias allow for an altogether new approach. The grounds and/or the power leads can be connected at the pads themselves when the wafer is bumped on the back. In this technique, angled vias would point in different directions from the bump with respect to the in-plane component of their trajectory (see FIG. 24). As such, one bump on the back of the wafer can be connected to multiple contact points on the front of the wafer (e.g. one pad for four ground contacts is feasible).

The invention is not limited to the embodiments described but may be varied in construction and detail.

The invention claimed is:

1. A laser machining method comprising the steps of:
providing a gaseous environment around a machining site on a substrate comprising a semiconductor;
delivering a pulsed laser beam to the machining site to machine the substrate to form a via at the machining site, wherein at least one of laser-pulse energy and laser-pulse separation of the laser beam are varied during machining of the substrate according to optical, thermal and mechanical properties of the substrate being machined and oxygen or nitrogen concentration in the gaseous environment is controlled during machining of the substrate to control growth of a via lining, and
wherein the gaseous environment comprises a gas having properties for dissociation in the presence of the laser beam and the dissociated gas at least one of reduces a quantity of debris generated and enhances removal of debris.

2. A method as claimed in claim 1, wherein oxygen or nitrogen concentration in the gaseous environment is controlled during machining to control or prevent oxide or nitride growth on the internal sidewall of the via.

3. A method as claimed in claim 1, wherein providing a gaseous environment comprises introducing a controlled amount of inert gas into the gaseous environment.

4. A method as claimed claim 1, wherein the gaseous environment comprises a gas having properties for dissociation in the presence of the laser beam, wherein the dissociated gas etches the substrate.

5. A method as claimed in claim 1, wherein at least one of the laser beam's pulse energy, inter-pulse separation, and number-of-pulses-per-machining-step are varied as a function of current via depth.

6. A method as claimed in claim 1, wherein the laser beam and the gaseous environment are controlled to provide an electrically insulating lining, and the method comprises the further step of filling the via with an electrically conducting material to provide an electrical conductor in the substrate.

7. A method as claimed in claim 1, wherein the laser beam and the gaseous environment are controlled to provide an optically opaque lining, and the method comprises the further step of filling the via with an optically transmissive material to provide an optical waveguide in the substrate with the lining as a cladding.

8. A method as claimed in claim 1, wherein the laser beam and the gaseous environment are controlled to provide a thermally conductive path, and the method comprises the further step of filling the via with a thermally conductive material to provide a thermally conductive path in the substrate.

9. A method as claimed in claim 8 comprising the further step of connecting a heat sink to the thermally conductive material in the via.

10. A laser machining method comprising the step of delivering a laser beam onto a substrate to machine the substrate, wherein the beam is delivered to a plurality of sites in a pass so as to machine the substrate at the plurality of sites, and wherein the beam is delivered to at least a portion of the plurality of sites in a subsequent pass so as to further machine the substrate at the portion of the plurality of sites, such that an extent of a heat affected zone at each site is reduced compared with an extent of a heat affected zone produced by completely drilling in sequence each via in a single pass, wherein at least one of the laser beam's laser-pulse energy, laser-pulse separation, and number-of-pulses varies from pass to pass, and wherein beam delivery is controlled to both machine a formation at each site and to provide an electrically insulating lining on a substrate wall at each site.

11. A method as claimed in claim 10 wherein a via is drilled at each site.

12. A method as claimed in claim 10, wherein a controlled gaseous environment is provided during machining at the machining sites to assist lining growth in a controlled manner.

13. A method as claimed in claim 12, wherein gas and gas parameters may be changed between subsequent passes.

14. A laser machining method comprising the steps of:
delivering a laser beam onto a substrate on an X-Y table positioning system using an optical system comprising a galvanometer and a non-telecentric lens to machine the substrate at a machining site, wherein the laser beam is pulsed, and wherein the laser beam is delivered at an acute angle to a surface of the substrate to form a via that is angled to the surface of the substrate;
providing a gaseous environment around the machining site, wherein providing the gaseous environment around the machining site comprises introducing and regulating one or more gases in the gaseous environment, such that at least one of: (i) at least one of an oxide layer and nitride layer is grown on an internal sidewall of the via and (ii) at least one of an oxide layer and nitride layer is prevented from being formed on the internal sidewall of the via, wherein the gaseous environment comprises a gas having properties for dissociation in the presence of the laser beam and the dissociated gas at least one of reduces a quantity of debris generated and enhances removal of debris; and
synchronizing the X-Y table positioning system with the galvanometer directing the laser beam and the laser beam to control a wafer position relative to an object field point at which the laser beam forms a desired angle of the angled via relative to a normal angle of the optical system,
wherein at least one of laser-pulse energy and laser-pulse separation of the laser beam are varied during machining of the substrate according to optical, thermal and mechanical properties of the substrate being machined.

15. A method as claimed in claim 14, wherein the via is drilled to interconnect layers in the substrate.

16. A method as claimed in claim 14, wherein the via is drilled for conformity with component leads to be mounted on the substrate.

17. A method as claimed in claim 14, wherein a plurality of interconnecting vias are drilled.

18. A method as claimed in claim 17, wherein the vias are drilled to interconnect at the substrate surface.

19. A method as claimed in claim 18, wherein the vias are drilled to interconnect internally within the substrate and to each have a separate opening in a substrate surface.

20. A laser machining method as claimed in claim 1, the method further comprising filling the via with a thermally conductive material to provide a thermal conductor.

21. A method as claimed in claim 20, comprising connecting a heat sink to the thermally conductive material.

22. A method as claimed in claim 21, the method further comprising drilling another via adjacent to said via and filling said other via with an electrically conductive material, and connecting an electrical component to said electrically conductive material.

23. A method as claimed in claim 20, wherein the via is a blind via.

24. A method as claimed in claim 20, wherein angled vias are generated in a geometry that allows multiple via contact points on one side of a substrate to a single contact point on the other side of the substrate.

25. A method as claimed in claim 24, wherein multiple power inputs and outputs or multiple ground inputs and outputs are consolidated to a reduced number of inputs and outputs.

26. A method as claimed in claim 20, wherein angled vias are used to reduce the size of a device by allowing connection pads to be placed on the back side of the substrate.

27. A method as claimed in claim 1, wherein the laser beam is generated by a solid state diode pumped laser source.

28. A method as claimed in claim 27, wherein the laser source is a frequency multiplied solid state laser source.

29. A method as claimed in claim 27, wherein the laser source is a solid state laser source in which the laser medium is of the type Host:Impurity and in which the host is YAG, YLF, or Vanadate.

30. A method as claimed in claim 27, wherein the laser repetition frequency is in the range from 1 kHz to 200 kHz.

31. A method as claimed in claim 27, where the laser source comprises means for generating a laser beam with pulsewidth less than 200 nanoseconds.

32. A method as claimed in claim 27, wherein the laser pulsewidth is less than 200 nanoseconds.

33. A method as claimed in claim 27, wherein the laser source comprises means for generating a laser beam with a pulsewidth less than 10 nanoseconds.

34. A method as claimed in claim 27, wherein the laser pulsewidth is less than 10 nanoseconds.

35. A laser machining method as claimed in claim 10, wherein the substrate is a multilayer structure that includes different materials, and wherein laser pulse and beam properties are changed for the at least one subsequent pass such that the different materials of the multilayer structure are efficiently machined at each pass.

36. A laser machining method as claimed in claim 1, wherein the substrate is a multilayer structure that includes different materials, wherein the laser beam's laser-pulse energy, laser-pulse separation, and number-of-pulses are controlled during machining of the multilayer structure such that the different materials of the multilayer structures are efficiently machined.

37. A method as claimed in claim 1, wherein providing the gaseous environment comprises at least one of (i) regulating a concentration of a given gas in the gaseous environment and (ii) regulating a flow rate of a given gas in the gaseous environment.

38. A method as claimed in claim 2, wherein growing an oxide layer on the internal sidewall of the via comprises maintaining or varying an oxygen concentration in the gaseous environment.

39. A method as claimed in claim 2, wherein growing a nitride layer on the internal sidewall of the via comprises maintaining or varying a nitrogen concentration in the gaseous environment.

40. A method as claimed in claim 2, wherein preventing an oxide layer from, forming on the internal sidewall of the via comprises maintaining or varying at least one of a helium concentration and argon concentration in the gaseous environment.

41. A method as claimed in claim 1, further comprising introducing and regulating a photo-activated gas in the gaseous environment to reduce debris formation during machining of the substrate.

42. A method as claimed in claim 41, wherein the photo-activated gas includes at least one of a fluorocarbon gas, a chlorofluorocarbon gas, and a halocarbon gas.

43. A method as claimed in claim 1, wherein the via is a blind via.

44. A method as claimed in claim 2, wherein the via is an angled via.

45. A method as claimed in claim 1, wherein delivering the laser beam onto the substrate to form the via at the machining site comprises delivering the laser beam to form a plurality of vias at a corresponding plurality of machining sites.

46. A method as claimed in claim 45, wherein delivering the laser beam onto the substrate to form the plurality of vias at the corresponding plurality of machining sites comprises delivering the laser beam to a first via position to partially form a first via, delivering the laser beam to a second via position to partially form a second via, and delivering the laser beam to the first via position to continue formation of the first via.

47. A method as claimed in claim 46, wherein at least one of the laser beam's laser-pulse energy, laser-pulse separation, and number-of-pulses varies from pass to pass.

48. A method as claimed in claim 1, wherein delivering the laser beam onto the substrate to form the via at the machining site comprises scanning the laser beam in an elliptical shape.

49. A method as claimed in claim 48, wherein scanning the laser beam in the elliptical shape comprises scanning the laser beam in a series of concentric elliptical shapes.

50. A method as claimed in claim 48, wherein the elliptical shape is a circle.

51. A method as claimed in claim 1, wherein delivering the laser beam onto the substrate to form the via at the machining site comprises using a zoom telescope in conjunction with a scan lens to enable a focus spot of the laser beam to be adjusted.

52. A method as claimed in claim 11, wherein a via formed at a given site is a blind via, and wherein a via formed at another site is an angled via.

53. A method as claimed in claim 14, further comprising introducing and regulating a photo-activated gas in the gaseous environment to reduce debris formation during machining of the substrate.

* * * * *

UNITED STATES PATENT AND TRADEMARK OFFICE
CERTIFICATE OF CORRECTION

| | | |
|---|---|---|
| PATENT NO. | : 7,887,712 B2 | Page 1 of 1 |
| APPLICATION NO. | : 10/102702 | |
| DATED | : February 15, 2011 | |
| INVENTOR(S) | : Boyle et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 225 days.

Signed and Sealed this
Ninth Day of August, 2011

David J. Kappos
*Director of the United States Patent and Trademark Office*